(12) United States Patent
Zhang et al.

(10) Patent No.: US 9,153,705 B2
(45) Date of Patent: Oct. 6, 2015

(54) VERTICAL MEMORY DEVICES AND METHODS OF MANUFACTURING THE SAME

(71) Applicants: Gang Zhang, Gyeonggi-Do (KR); Kyoung-Sub Shin, Gyeonggi-Do (KR)

(72) Inventors: Gang Zhang, Gyeonggi-Do (KR); Kyoung-Sub Shin, Gyeonggi-Do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 18 days.

(21) Appl. No.: 14/187,548

(22) Filed: Feb. 24, 2014

(65) Prior Publication Data

US 2014/0239376 A1 Aug. 28, 2014

(30) Foreign Application Priority Data

Feb. 26, 2013 (KR) ........................ 10-2013-0020381

(51) Int. Cl.
*H01L 27/115* (2006.01)
*H01L 29/792* (2006.01)
*H01L 29/78* (2006.01)
*H01L 27/105* (2006.01)
*H01L 27/24* (2006.01)
*H01L 29/66* (2006.01)

(52) U.S. Cl.
CPC .......... *H01L 29/792* (2013.01); *H01L 27/1052* (2013.01); *H01L 27/11575* (2013.01); *H01L 27/11578* (2013.01); *H01L 27/11582* (2013.01); *H01L 27/2481* (2013.01); *H01L 29/66833* (2013.01); *H01L 29/7827* (2013.01); *H01L 29/7926* (2013.01)

(58) Field of Classification Search
CPC ..................... H01L 27/1052; H01L 27/11578; H01L 27/2481
See application file for complete search history.

(56) References Cited

U.S. PATENT DOCUMENTS

| | | | |
|---|---|---|---|
| 7,106,625 B2 | 9/2006 | Yeh | |
| 7,514,321 B2 * | 4/2009 | Mokhlesi et al. | ............. 438/259 |
| 7,575,973 B2 * | 8/2009 | Mokhlesi et al. | ............. 438/259 |
| 7,745,265 B2 * | 6/2010 | Mokhlesi et al. | ............. 438/129 |
| 7,808,038 B2 * | 10/2010 | Mokhlesi et al. | ............. 257/328 |
| 7,848,145 B2 * | 12/2010 | Mokhlesi et al. | ........ 365/185.17 |
| 7,851,851 B2 * | 12/2010 | Mokhlesi et al. | ............. 257/326 |
| 7,940,574 B2 | 5/2011 | Masuoka et al. | |
| 8,436,414 B2 | 5/2013 | Tanaka et al. | |
| 8,508,999 B2 * | 8/2013 | Liu et al. | .................. 365/185.17 |
| 9,019,767 B2 * | 4/2015 | Aritome et al. | .......... 365/185.17 |
| 2010/0155818 A1 | 6/2010 | Cho et al. | |
| 2011/0057250 A1 | 3/2011 | Higashi | |
| 2011/0286283 A1 | 11/2011 | Lung et al. | |

(Continued)

FOREIGN PATENT DOCUMENTS

| JP | 2010-050127 A | 3/2010 |
|---|---|---|
| JP | 2010-192569 A | 9/2010 |

(Continued)

*Primary Examiner* — Evan Pert
(74) *Attorney, Agent, or Firm* — Lee & Morse, P.C.

(57) ABSTRACT

A memory device includes a plurality of channels, a plurality of first charge storage sites coupled to first sides of respective ones of the channels, and a plurality of second charge storage sites coupled to second sides of respective ones of the channels. The first charge storage sites correspond to first memory cells and the second charge storage sites coupled to second memory cells. At least one of the channels is a dummy channel not connected to a bit line, and a blocking layer is contiguously formed around the first and second charge storage sites and the channels.

20 Claims, 42 Drawing Sheets

(56) References Cited

U.S. PATENT DOCUMENTS

2012/0064683 A1    3/2012    Ishiduki et al.
2012/0086072 A1    4/2012    Yun et al.

FOREIGN PATENT DOCUMENTS

KR    10-2010-0074543 A    7/2010
KR    10-2010-0111798 A    10/2010

* cited by examiner

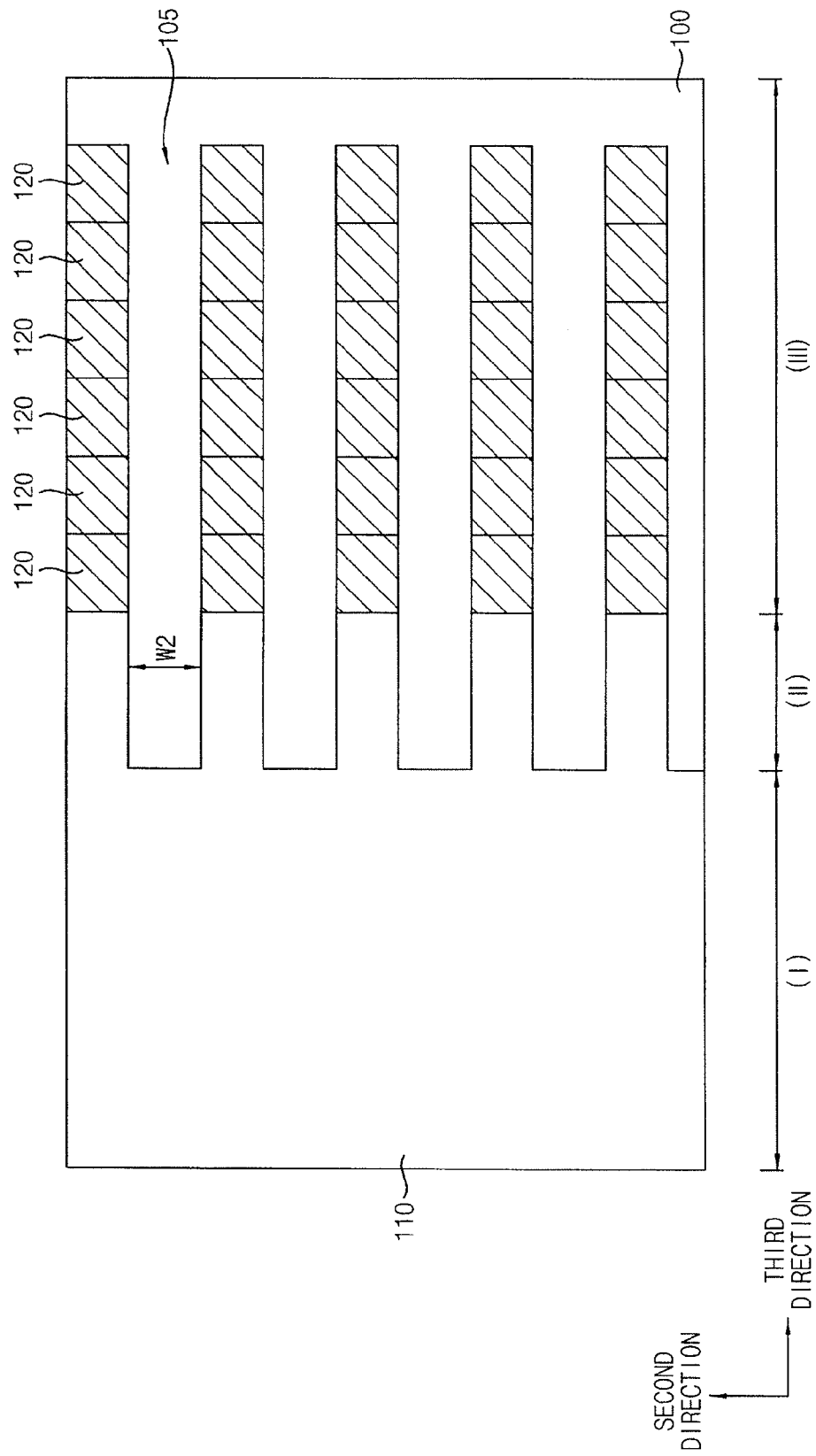

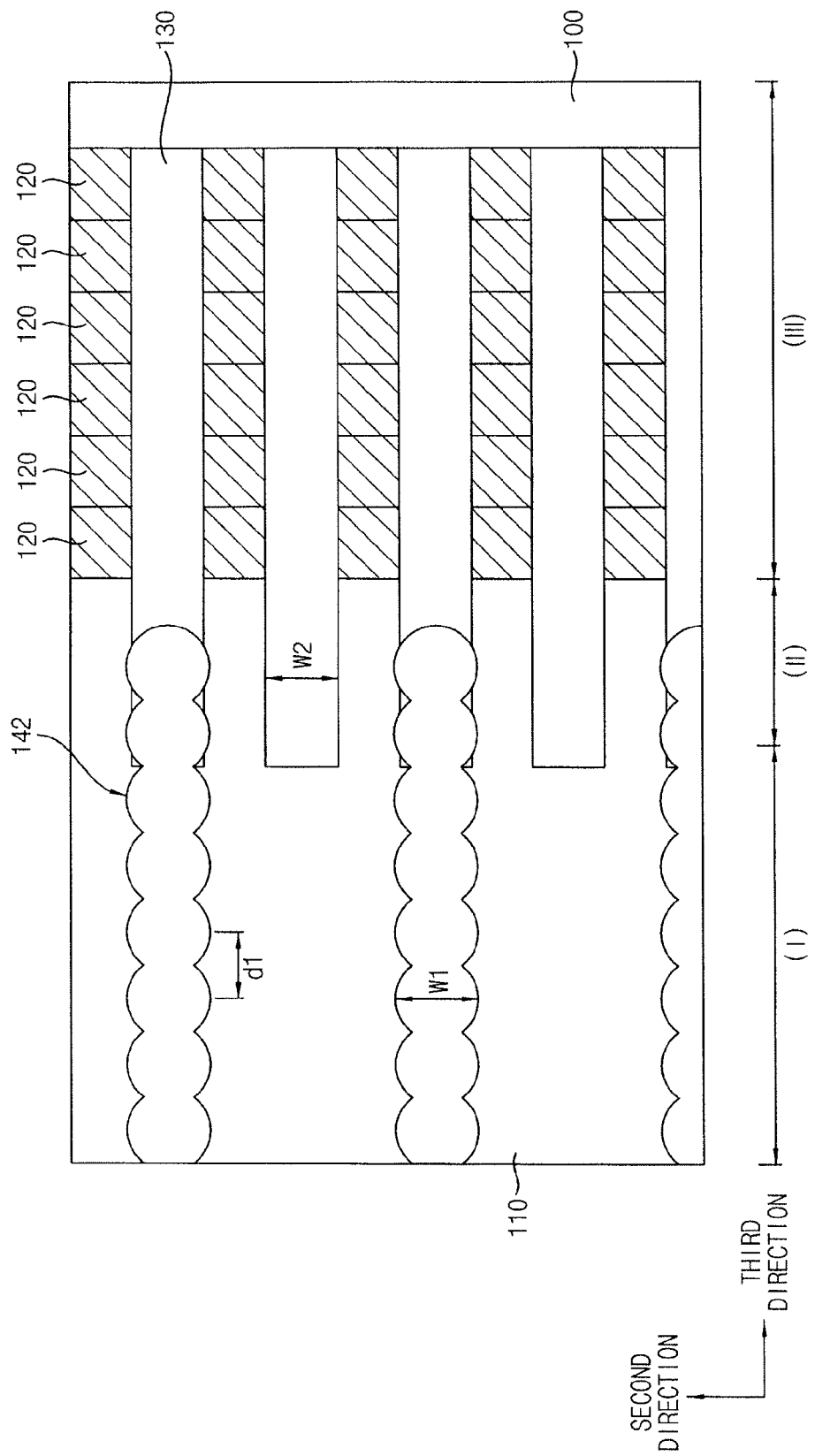

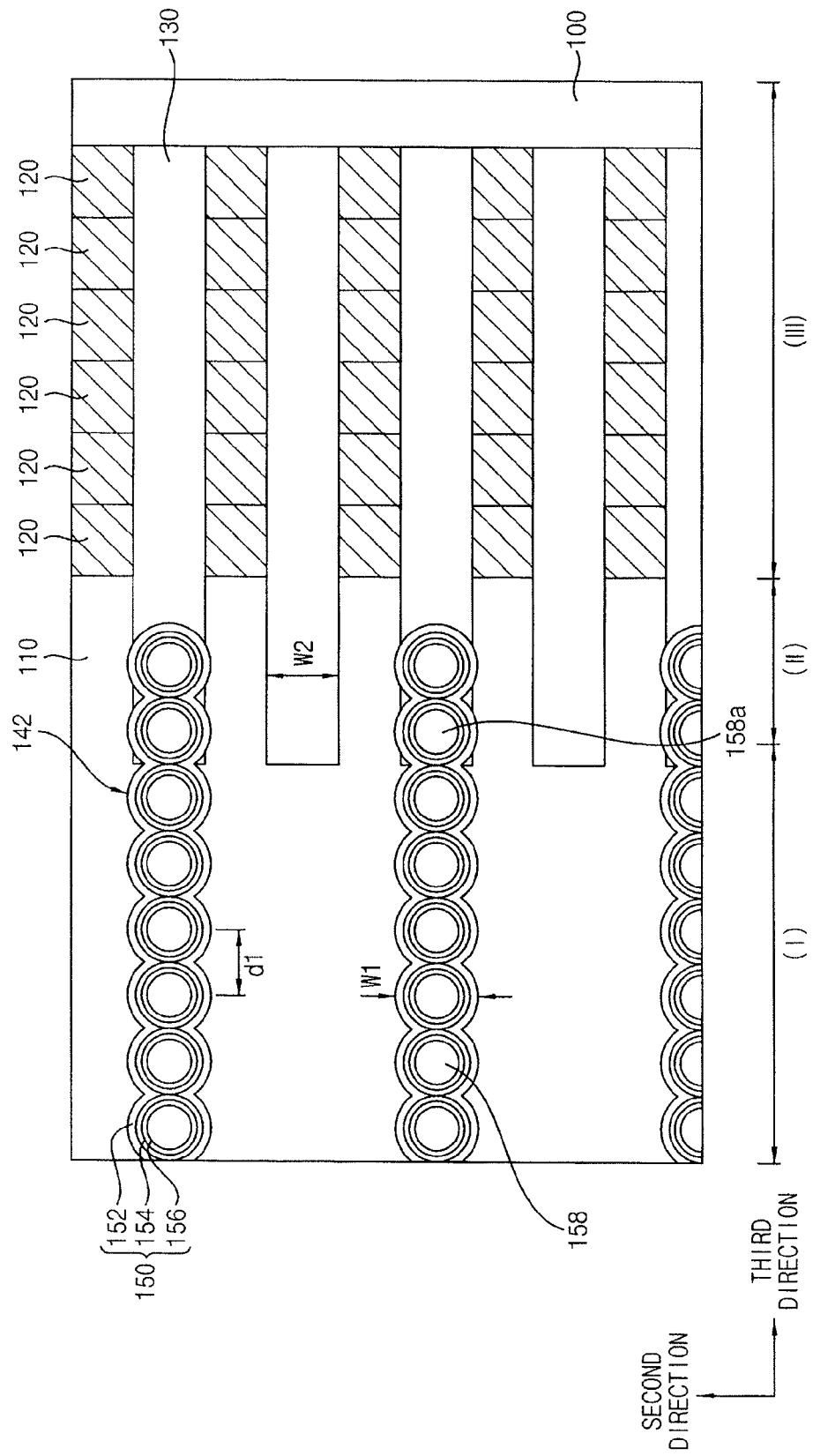

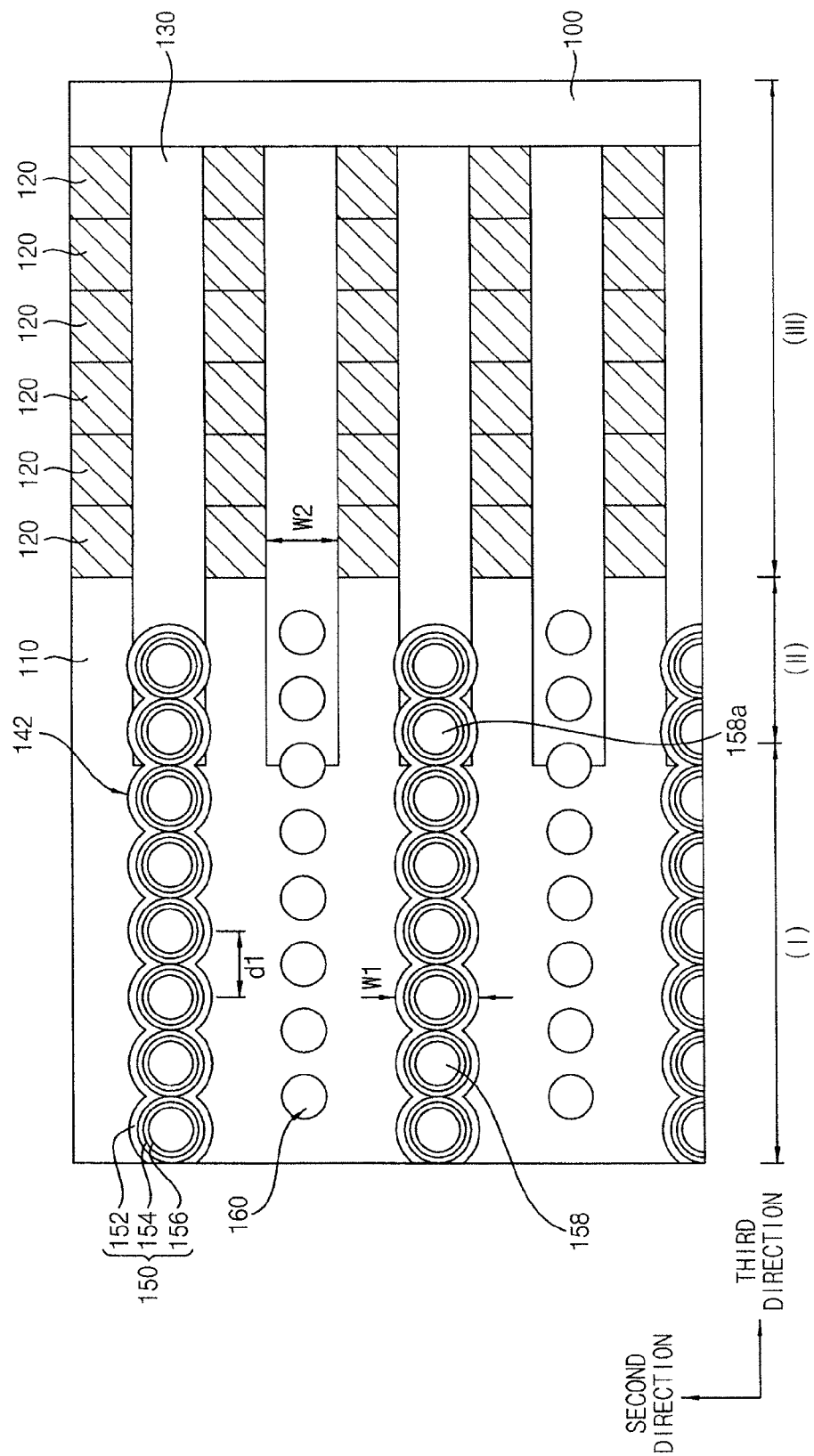

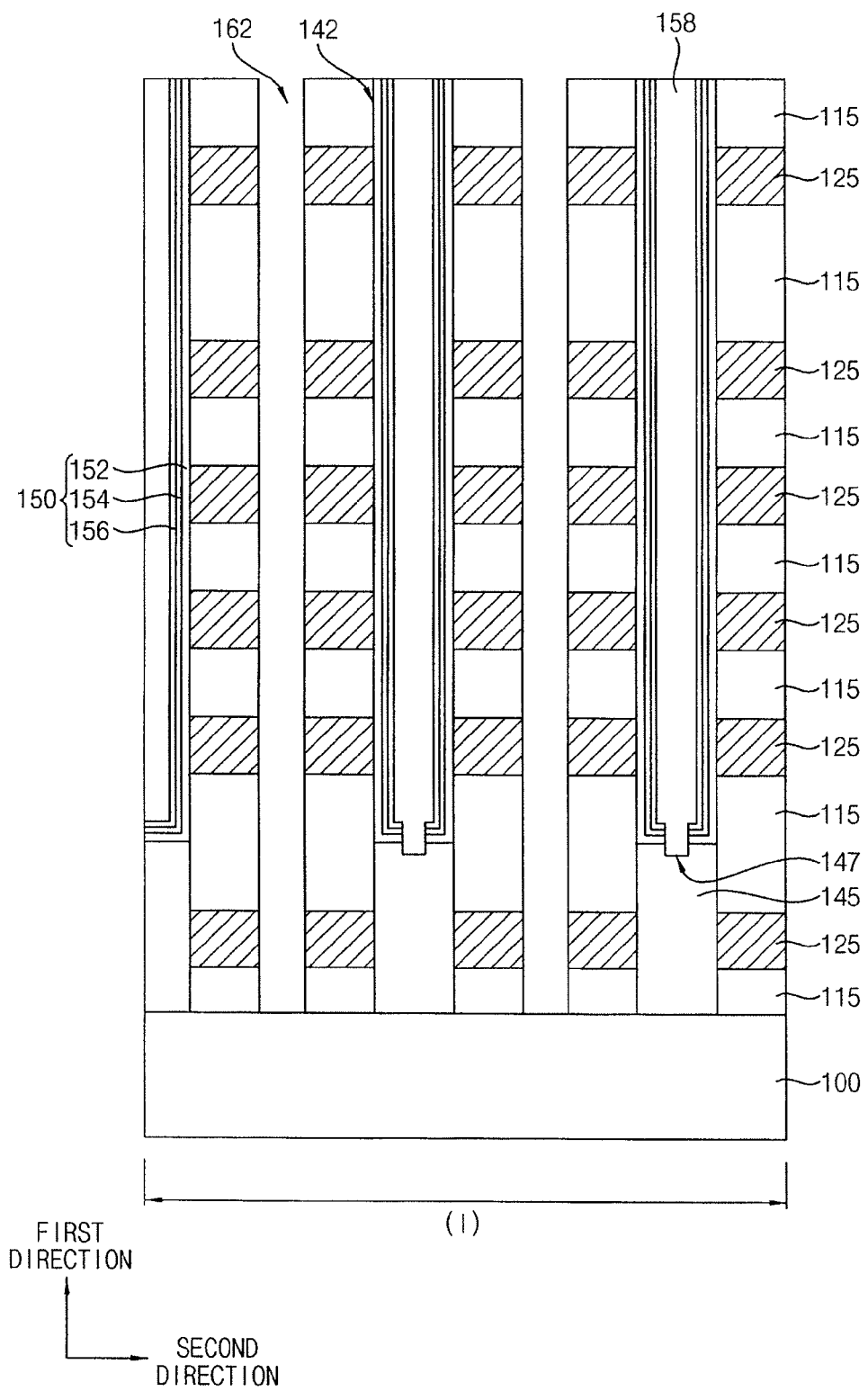

VERTICAL MEMORY DEVICES AND METHODS OF MANUFACTURING THE SAME

CROSS-REFERENCE TO RELATED APPLICATION

Korean Patent Application No. 10-2013-0020381, filed on Feb. 26, 2013, and entitled, "Vertical Memory Devices and Methods of Manufacturing the Same," is incorporated by reference herein in its entirety.

BACKGROUND

1. Field

One or more embodiments described herein relate to memory devices.

2. Description of the Related Art

In a process of manufacturing a vertical non-volatile memory device, an insulation layer and a sacrificial layer may be alternately and repeatedly formed on a substrate. Holes may be formed through the insulation layers and the sacrificial layers, and oxide/nitride/oxide (ONO) layers and channels filling the holes may be formed. An opening may be formed through the insulation layers and the sacrificial layers, and the sacrificial layers exposed by the opening may be removed to form a gap exposing the channel. A gate electrode may be formed to fill the gap.

SUMMARY

In accordance with one embodiment, a vertical memory device includes a plurality of channel columns including a plurality of channels extending in a first direction perpendicular to a top surface of a substrate, the channels being arranged along a third direction parallel to the top surface of the substrate; a plurality of charge storage structures including a plurality of tunnel insulation layer patterns, a plurality of charge storage layer patterns, and a blocking layer pattern respectively, the plurality of tunnel insulation layer patterns and the plurality of charge storage layer patterns being sequentially stacked on sidewalls of respective ones of the channels, the blocking layer pattern surrounding the charge storage layer patterns formed on the sidewalls of the channels included in each channel column; and a plurality of gate electrodes spaced apart from each other in the first direction on the sidewalls of each charge storage structure.

The charge storage layer patterns may be spaced apart from each other by the blocking layer pattern in the third direction. The charge storage layer patterns may contact each other in the third direction. The gate electrodes are spaced apart from each other along a second direction perpendicular to the third direction by the channel column and the charge storage structures.

The channel columns and the charge storage structures may be alternately and repeatedly arranged in the second direction. Each of the charge storage layer patterns may include two charge storage sites spaced from each other in the second direction having each of the channels as a center.

Also, a distance between the centers of the adjacent channels in the third direction may be smaller than a width of the charge storage structure in the second direction.

The memory device may include word line pads contacting each of the gate electrodes and extending in the third direction, and dummy channels arranged between the channels and the word line pads.

In accordance with another embodiment, a method of manufacturing a vertical memory device includes forming a plurality of insulation layers and a plurality of sacrificial layers alternately and repeatedly on a substrate; forming a plurality of first holes through the insulation layers and the sacrificial layers in a second direction to expose a top surface of the substrate, the first holes extending in a third direction substantially parallel to the top surface of the substrate; forming a first blocking layer pattern, first charge storage layer patterns, first tunnel insulation layer patterns, and first channels on sidewalls of the first holes; forming a plurality of second holes through the insulation layers and the sacrificial layers between the first holes to expose the top surface of the substrate, and the second holes extending in the third direction; removing the sacrificial layers exposed by the second holes to form a plurality of gaps between the insulation layers in a first direction passing through the top surface of the substrate; forming a gate electrode to fill each of the gaps; and forming a second blocking layer pattern, second charge storage layer patterns, second tunnel insulation layer patterns, and second channels on a sidewall of each of the second holes.

The first channels may be spaced from one another in the third direction.

Forming the plurality of first holes may include forming first preliminary holes through the insulation layers and the sacrificial layers to expose the substrate in the third direction; and partially removing the insulation layers and sacrificial layers exposed by the first preliminary holes to allow the first preliminary holes to be in fluid communication with each other in the third direction. A width of each of the holes in the second direction may be larger than a distance between centers of adjacent ones of the first preliminary holes in the third direction.

Forming the gate electrodes may include forming a gate electrode layer filling the gaps and the second holes; and removing a portion of the gate electrode filling the second holes. Forming the gate electrodes includes forming the gate electrodes to be spaced apart from each other in the second direction.

In accordance with another embodiment, a memory device includes a plurality of channels; a plurality of first charge storage sites coupled to first sides of respective ones of the channels; and a plurality of second charge storage sites coupled to second sides of respective ones of the channels, wherein the first charge storage sites correspond to first memory cells and the second charge storage sites coupled to second memory cells.

A blocking layer may be contiguously formed around the first and second charge storage sites and the channels. A distance between centers of adjacent ones of the channels may be less than a distance between a first surface of the blocking layer adjacent the first charge storage sites and a second surface of the blocking layer adjacent the second charge storage sites.

At least one channel may be a dummy channel not coupled to a bit line, and at least another channel may be coupled to a bit line. The channels may be substantially in a shape of a column.

BRIEF DESCRIPTION OF THE DRAWINGS

Features will become apparent to those of skill in the art by describing in detail exemplary embodiments with reference to the attached drawings in which:

FIG. 7B, FIG. 8B, FIG. 9B, FIG. 10B, FIG. 11B, FIG. 12B, FIG. 16B, and FIG. 17B illustrate top views of these different stages, respectively;

FIG. 10C, FIG. 12C, FIG. 13, FIG. 14, FIG. 15, FIG. 16D, and FIG. 20B illustrate vertical cross-sectional views of the semiconductor device.

DETAILED DESCRIPTION

Figure 1:
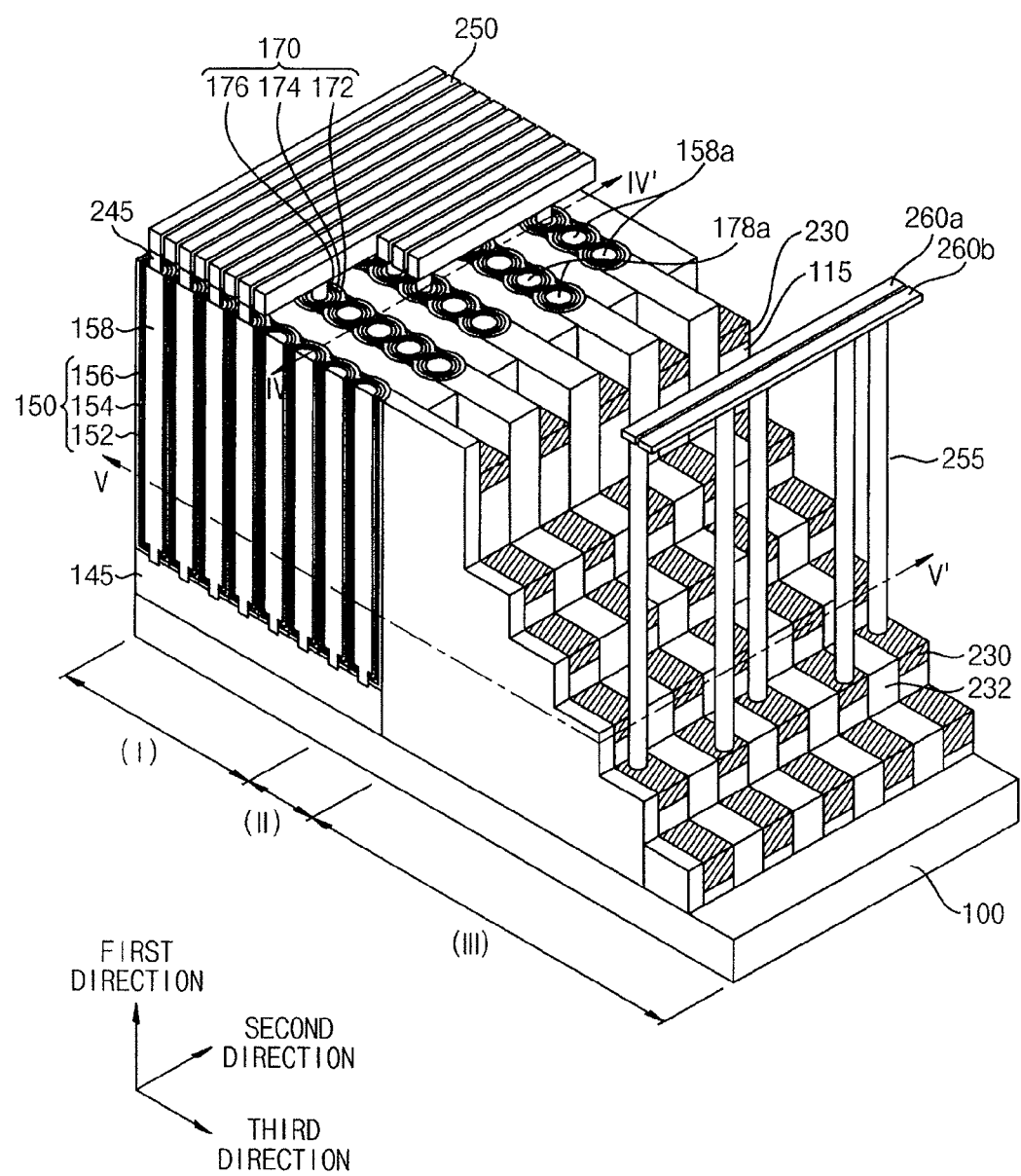
FIG. 1 illustrates an embodiment of a vertical memory device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Figure 2:
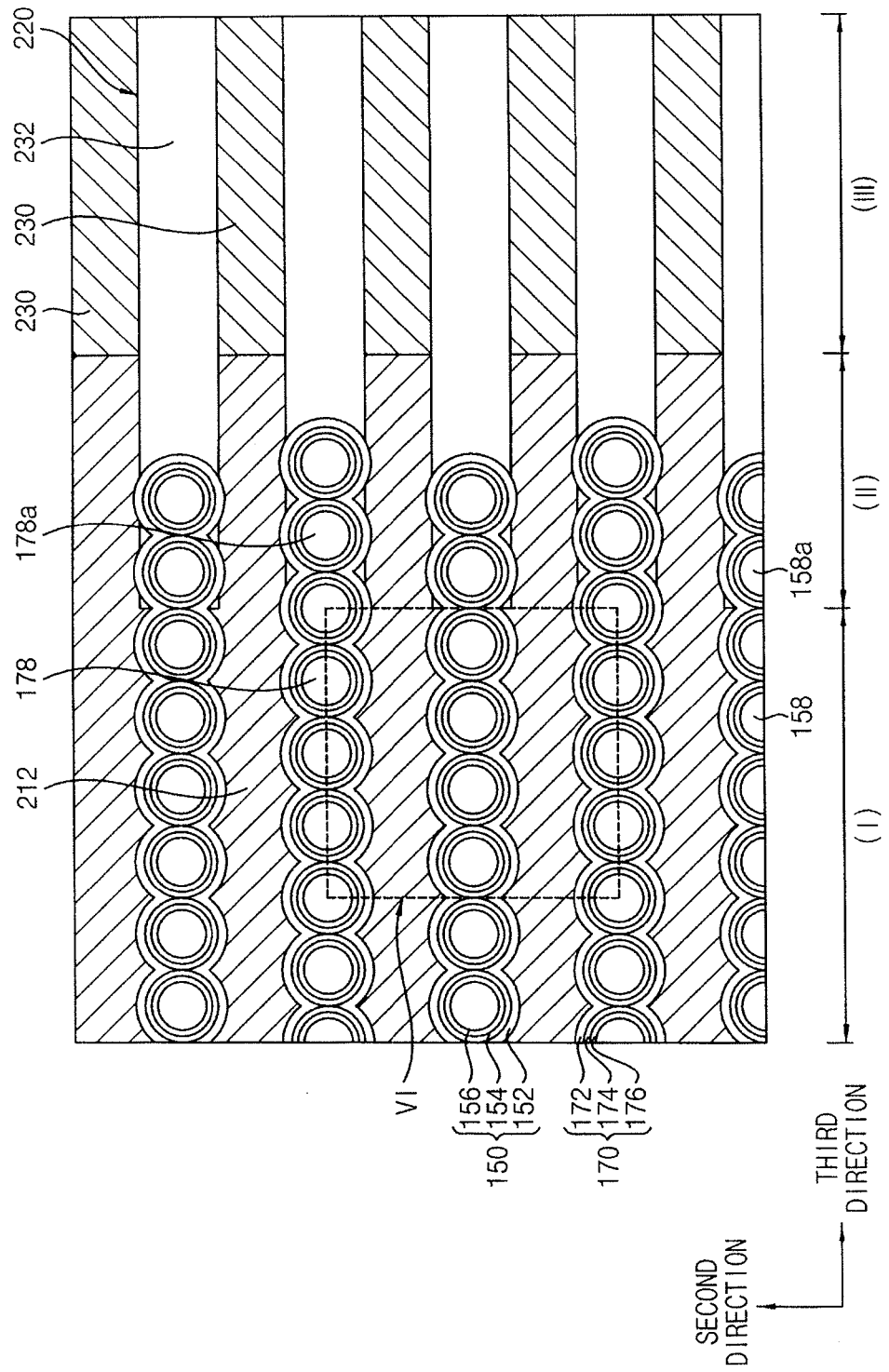
FIG. 2 illustrates a view along the line section line V-V' in FIG. 1.
Figure 3:
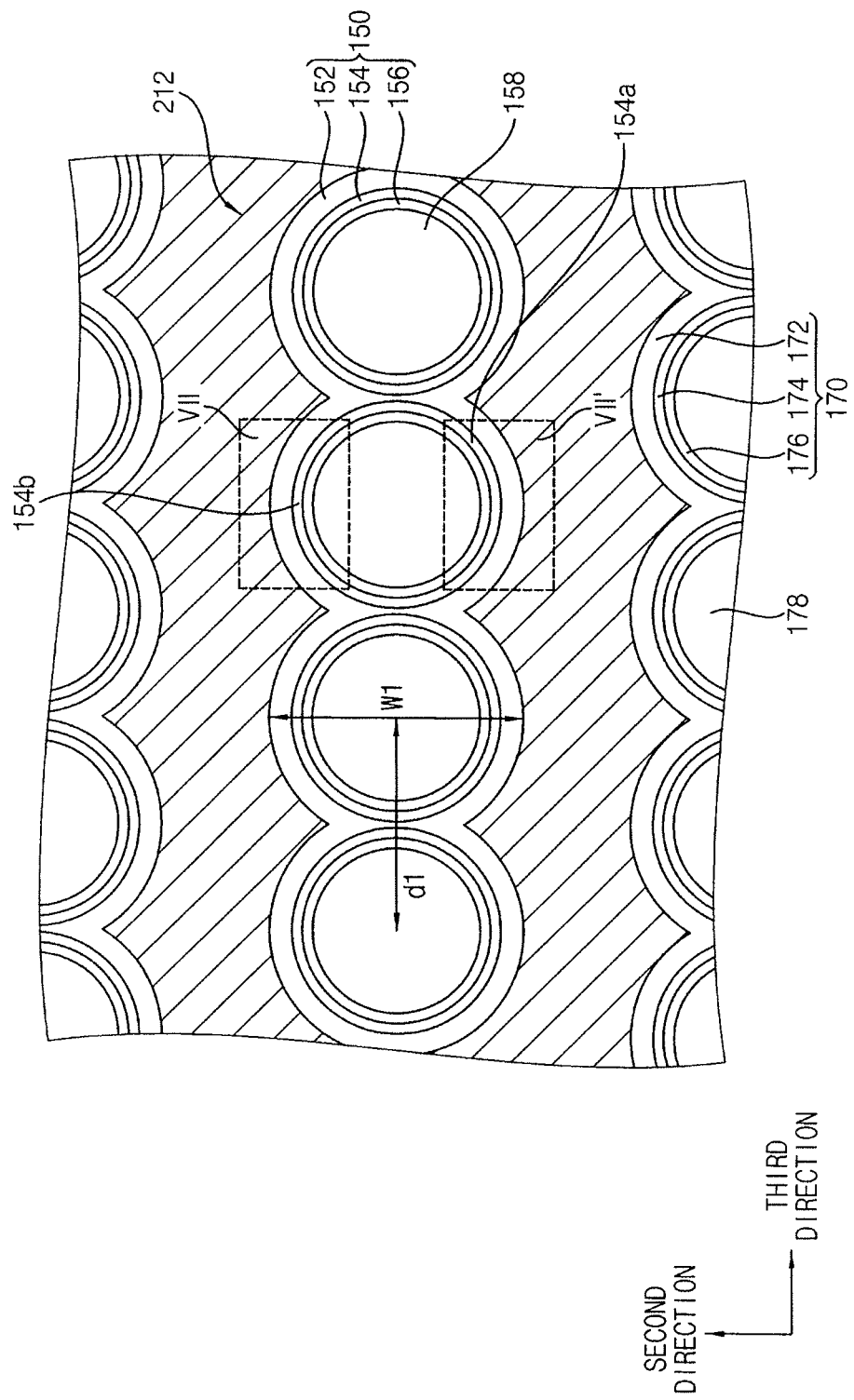
FIG. 3 illustrates an enlarged view of area of VI in FIG. 2.
Figure 4:
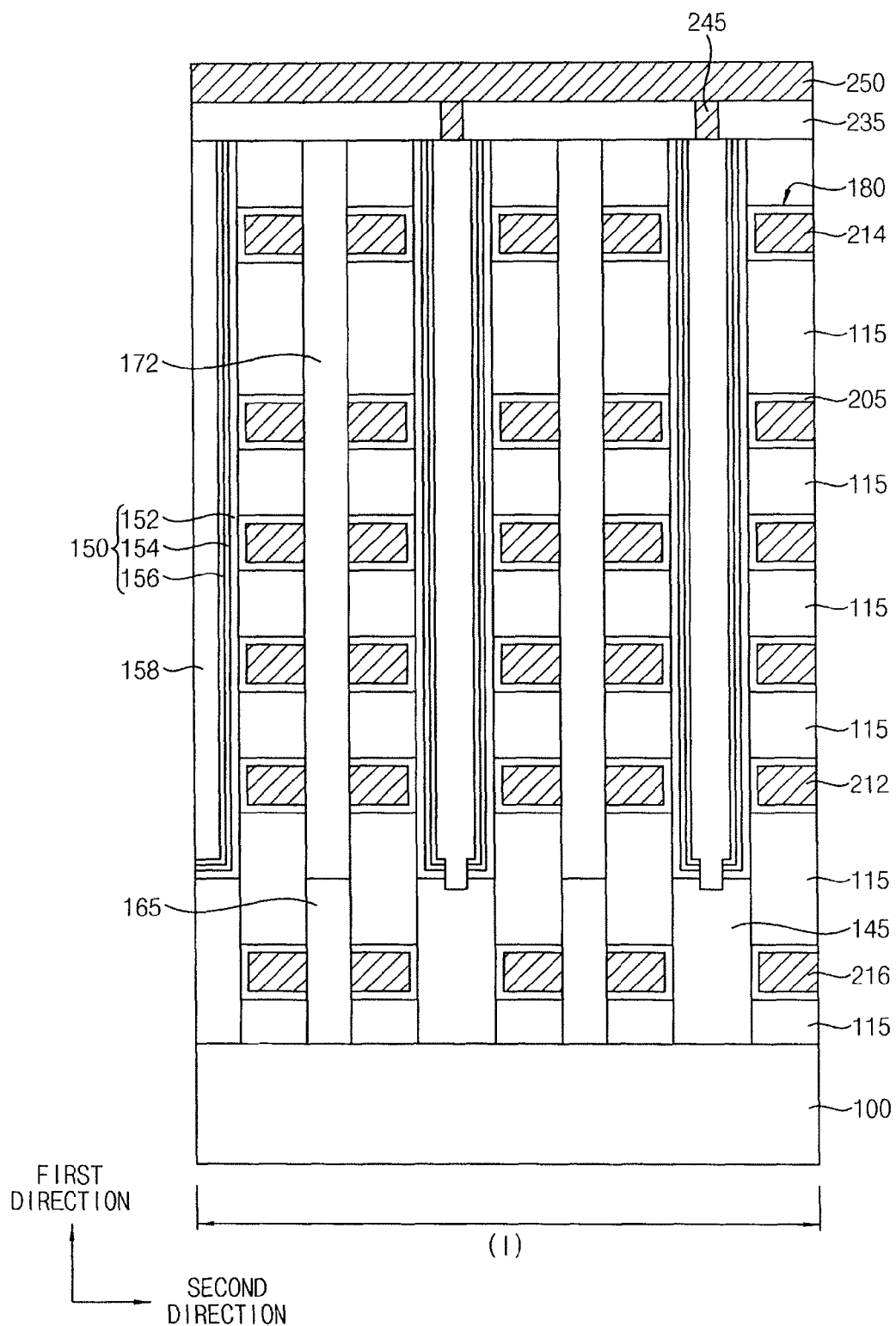
FIG. 4 illustrates a view along section line IV-IV' in FIG. 1.

FIG. 1 illustrates an embodiment of a vertical memory device, and FIG. 2 illustrates a horizontal cross-sectional view of the semiconductor device in FIG. 1 cut along the line V-V'. FIG. 3 illustrates a horizontal cross-sectional enlarged view of area VI in FIG. 2, and FIG. 4 illustrates a vertical cross-sectional view of the semiconductor device in FIG. 1 cut along the line IV-IV'.

For convenience of the explanation, FIG. 1 does not show all elements of the semiconductor device, but only shows some elements thereof, e.g., a substrate, a semiconductor pattern, a channel, a gate electrode, a pad, a bit line contact, and a bit line, etc. In all figures in this specification, a direction substantially perpendicular to a top surface of the substrate is referred to as a first direction, and two directions substantially parallel to the top surface of the substrate and substantially perpendicular to each other are referred to as a second direction and a third direction. Additionally, a direction indicated by an arrow in the figures and a reverse direction thereto are considered as the same direction. The definition of the direction mentioned above is identical in all figures.

Referring to FIGS. 1 to 4, the vertical memory device may include a plurality of first and second channels 158 and 178, each of which may extend in the first direction on a substrate 100. The device also includes first and second tunnel insulation layer patterns 156 and 176, first and second charge storage layer patterns 154 and 174, and first and second blocking layer patterns 152 and 172 sequentially stacked on an outer sidewall of respective ones of the first and second channels 158 and 178. The device also includes an auxiliary blocking layer pattern 205 that may be sequentially stacked on and may surround a portion of the outer sidewall of respective ones of the first and second channels 158 and 178.

Additionally, the vertical memory device may include gate electrodes 212, 214 and 216 that may be formed on sidewalls of the auxiliary blocking layer patterns 205 and that may surround a portion of the outer sidewall of each of the first and second channels 158 and 178. The vertical memory device may further include bit lines 250 and connecting lines 260a and 260b.

The substrate 100 may made from a semiconductor material (e.g., silicon, germanium, etc), and may include a first region I, a second region II and a third region III. In example embodiments, the first region I may be a cell region at which the first and second channels 158 and 178 may be located. The third region III may be a connecting line region at which a word line pad 230 contacting the gate electrodes 212, 214 and 216 formed. The third region III may be arranged to be spaced apart from the first region I in the third direction. The second region II may be located between the first region I and the third region III, and may be a dummy region at which a first dummy channel and a second dummy channel 158a and 178a located.

Each of the channels 158 and 178 may extend in the first direction on the first region I and the dummy channels 158a and 178a may extend in the first direction in the second region II. In example embodiments, the first and second channels 158 and 178 may have a pillar shape. In other example embodiments, the first and second channels 158 and 178 may have a cup shape of which a central bottom is opened. A space defined by an inner wall of the first and second channel 158 and 178 may be filled by an insulation layer pattern. For example, the first and second channel 158 and 178 may include doped or undoped polysilicon or single crystalline silicon.

In example embodiments, a plurality of first and second channels 158 and 178 may be arranged in both the second and third directions. Thus, a channel array may be defined. In example embodiments, the channel array may have a plurality of first channel columns and a plurality of second channel columns. In example embodiments, each of the first channel columns may include the plurality of first channels 158 arranged in the third direction, and each of the second channel columns may include the plurality of second channels 178 arranged in the third direction and being spaced apart from the first channel column at a given distance. The first and second channels 158 and 178 may be arranged in a zigzag pattern with respect to the second direction and, thus, more first and second channels 158 and 178 may be arranged in a given area.

Additionally, the first channel 158 disposed in the second region II may be defined as the first dummy channel 158a, and the second channel 178 disposed in the second region II may be defined as the second dummy channel 178a. The first and second dummy channels 158a and 178a may be substantially identical to the first and second channel 158 and 178, except that the first and second dummy channels 158a and 178a do not electrically connect to a bit line 250 which will be described hereafter.

Referring to FIG. 3, the first tunnel insulation layer pattern 156, the first charge storage layer pattern 154, and the first blocking layer pattern 152 may be sequentially formed on an outer wall of each of the first channels 158 or the first dummy channels 158a. The second tunnel insulation layer pattern 176, the second charge storage layer pattern 174, and the second blocking layer pattern 172 may be sequentially stacked on an outer wall of each of the second channels 178 or the second dummy channels 178a.

More particularly, the first and second tunnel insulation layer patterns 156 and 176, the first and second charge storage layer patterns 154 and 174, and the first and second blocking layer patterns 152 and 172 may surround the outer wall and a bottom surface of the each of the first and second channels 158 and 178, respectively. Thus, each of the first tunnel insulation layer patterns 156, the first charge storage layer patterns 154, and the first blocking layer patterns 152 may define a first charge storage structure or region 150. Each of the second tunnel insulation layer patterns 176, the second charge storage layer patterns 174, and the second blocking layer patterns 172 may define a second charge storage structure or region 170. In example embodiments, a plurality of first and second charge storage structures 150 and 170 may be formed corresponding to respective ones of the first and second channel columns.

In example embodiments, the first and second tunnel insulation layer patterns 156 and 176 may include an oxide (e.g., silicon oxide), the first and second charge storage layer patterns 154 and 174 may include a nitride (e.g., silicon nitride), and the first and second blocking layer patterns 152 and 172 may include an oxide, e.g., silicon oxide.

A distance between centers of adjacent first channels 158 in the third direction may be defined as a first distance d1. A width of the first charge storage structure 150 in the second direction may be defined as a first width w1. The first distance d1 may be substantially smaller than the first width w1 in some embodiments. Thus, each of the first blocking layer patterns 152 and/or the first charge storage layer patterns 154 may partially overlap in the third direction.

In example embodiments, adjacent ones of the first blocking layer patterns 152 may be arranged to contact each other in the third direction. Thus, each of the first blocking layer patterns 152 may be formed to contiguously surround, as a whole, the plurality of first channels 158 included in each of the first channel columns. On the other hand, the first charge storage layer patterns 154 and the tunnel insulation layer patterns 156 corresponding to adjacent channels may be spaced apart from each other in the third direction. Also, the first charge storage layer pattern 154 and the first tunnel insulation layer pattern 156 corresponding to each of the first channels 158 may be arranged to be separated from each other in the third direction by the first blocking layer patterns 152.

Similarly, adjacent ones of the second blocking layer patterns 172 may be arranged to contact each other in the third direction. Thus, each of the second blocking layer patterns 172 may be formed to contiguously surround, as a whole, the plurality of second channels 178 included in each of the second channel columns.

Referring now to FIG. 3, the first charge storage layer pattern 154 may include a first portion 154a and a second portion 154b that are spaced apart from each other in the second direction. Thus, two charge storage sites VII and VII' may be arranged in the second direction corresponding to each of the first channel 158. In other words, the first channel 158, the first tunnel insulation layer pattern 156, the first portion 154a of the first charge storage layer pattern 154, the first blocking layer pattern 152, and the word line 212 may define one memory cell unit. The first channel 158, the first tunnel insulation layer pattern 156, the second portion 154b of the first charge storage layer pattern 154, the first blocking layer pattern 152, and the word line 212 may define another memory cell unit. As a result, a plurality of charge storage sites and memory cells may be provided for a channel.

Referring to FIG. 4, first and second semiconductor patterns 145 and 165 contacting the top surface of the substrate 100 may be formed beneath the first and second channels 158 and 178, respectively. The first and second semiconductor patterns 145 and 165 may have recesses on upper surfaces. Therefore, the first and second channels 158 and 178 have a protrusion through the first and second charge storage structures 150 and 170 on the lower surface thereof. In other words, each of the first and second semiconductor patterns 145 and 165 may be directly connected to the first and second channels 158 and 178 through each of the protrusions. In example embodiments, the semiconductor patterns 145 and 165 may include a semiconductor material e.g., doped or undoped polysilicon, single crystalline silicon, poly germanium, and single crystalline germanium.

A pad may be formed on each of the first and second channels 158 and 178. In example embodiments, the pad may include doped or undoped polysilicon or single crystalline silicon.

In example embodiments, a plurality of first insulation layer patterns 115 arranged in the first direction may be formed on the first and second channels 158 and 178. In example embodiments, the first insulation layer pattern 115 may be formed to include e.g., silicon oxide. In addition, a space between the plurality of first insulation layer patterns 115 in the first region I and the second region II may be defined as a first gap 180, and a space between the plurality of first insulation layer patterns 115 in the third region III may be defined as a second gap 225.

The auxiliary blocking layer pattern 205 may surround outer sidewalls of the first blocking layer patterns 152 exposed by the first gap 180. Thus, portions of the outer sidewalls of the first and second channels 158 and 178 may be surrounded by the auxiliary blocking layer pattern 205. The auxiliary blocking layer pattern 205 may be further formed on inner walls of the first gap 180. Thus, top and bottom end portions of the auxiliary blocking layer pattern 205 may extend in both of the second and third directions. The auxiliary blocking layer pattern 205 may include, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide.

The gate electrodes 212, 214, and 216 may be formed on the auxiliary blocking layer pattern 205 to fill an inner portion of the first gap 180. In example embodiments, the gate electrodes 212, 214 and 216 may extend in the third direction in the first and second region I and II.

The gate electrodes 212, 214 and 216 may include a ground selection line (GSL) 216, a word line 212, and a string selection line (SSL) 214 sequentially arranged in the first direction.

Each of the GSL 216, the word line 212, and the SSL 214 may be formed at a single level (e.g., one of each, each at a different height) or more than one level. In an example embodiment, the GSL 216 and the SSL 214 may be at a single level, respectively, and the word line 212 may be at 4 levels between the GSL 216 and the SSL 214. In alternative embodiments, different numbers of lines may be formed. For example, the GSL 216 and the SSL 214 may be at two levels, and/or the word line 212 may be formed at 2, 8, 16, 24, 32, or more levels.

In example embodiments, the plurality of the gate electrodes 212, 214 and 216 may be arranged in the second direction. Particularly, each of the GSL 216 may be separated each other by the first and second channels 158 and 178 and the first and second charge storage structures 150 and 170 surrounding those in the first region I, and by the first and second dummy channels 158a and 178a and the first and second charge storage structures 150 and 170 surrounding those in the second region II, and by a third insulation layer pattern 232 in the third region. In addition, the plurality of the word line 212 and SSL 214 may be arranged in the second direction. Similar to the GSL 216, the word line 212 and SSL 214 may be divided by the first and second channels 158 and 178, the first and second dummy channels 158a and 178a, the first and second charge storage structures 150 and 170 and the third insulation layer pattern 232. In other words, the first and second channel columns and the gate electrodes 212, 214, and 216 may be alternately and repeatedly arranged in the second direction.

The channels 158 and 178, the charge storage structures 150 and 170, and the gate electrodes 212, 214 and 216 may define a memory cell. The memory cell may be formed on sidewalls of the channels 158 and 178, and a plurality of memory cells may be arranged in the first direction. Two memory cells spaced apart from each other in the second direction corresponding to the first channel 158 may be defined, as illustrated in FIG. 3.

Referring now to FIGS. 1 and 2, the word line pad 230 may be formed to fill the inner portion of the second gap 225. In example embodiments, a plurality of word line pads 230 may be arranged in the first and second directions corresponding to the gate electrodes 212, 214 and 216, respectively. Each of the word line pads 230 may extend in the third direction, and may have lengths sequentially different from each other in the first direction. For example, word line pads 230 at a lowermost level adjacent to the top surface of the substrate 100 may have a length longer than other word line pads 230. Thus, the word line pads 230 may be arranged in a form of a pyramid.

In example embodiments, the gate electrodes 212, 214 and 216 and the word line pads 230 may include a metal of a low resistance, e.g., tungsten, titanium, tantalum, platinum, etc.

The openings 220 between the gate electrodes 212, 214, and 216 in the third region III of the substrate 100 may be filled by the third insulation layer pattern 232. The third insulation layer pattern 232 may include an insulating material e.g., a silicon oxide.

The bit line 250 may be electrically connected to the first and second channels 158 and 178 through the bit line contact 245. The bit line 250 may include a metal, a metal nitride, a doped polysilicon, etc. In example embodiments, the bit line 250 may extend in the second direction, and a plurality of bit lines 250 may be arranged in the third direction.

The bit line contact 245 may be formed through a fourth insulation layer 235. The bit line contact 245 may include a metal, a metal nitride, a doped polysilicon, etc. A pad may be additionally formed between the bit line contacts 245 and the channels 158 and 178.

The fourth insulation layer 235 may be formed on the first and third insulation layer patterns 115 and 232, the first and second channels 158 and 178, and the first and second charge storage structures 150 and 170. In example embodiments, the fourth insulation layer 235 may include a dielectric material e.g., a silicon oxide.

Connecting lines 260a and 260b may be electrically connected to the word line pads 230 by connecting line contacts 255, and thus may be electrically connected to the gate electrodes 212, 214 and 216. The connecting lines 260a and 260b may include a metal, a metal nitride, a doped polysilicon, etc. In example embodiments, the connecting lines 260a and 260b may extend in the second direction. A plurality of connecting lines 260a and 260b may be arranged in the third direction. Each of the first and second connecting lines 260a and 260b may be arranged respectively corresponding to the word line pads 230 formed at the same level. In other words, the word line pads 230 may be alternately and repeatedly connected to the first and second connecting lines 260a and 260b through the connecting line contacts 255 arranged in a zigzag pattern. For example, when one of the word line pads 230 is connected to the first connecting line 260a, the other word line pad 230 adjacent thereto may be connected to the second connecting line 260b. Thus, different voltages may be applied to the word line pads 230 adjacent thereto and the word lines 212 connected thereto.

As described above, the vertical memory device may include the channels 158 and 178 and the charge storage structures 150 and 170 surrounding thereto. For example, the first charge storage layer pattern 154 in the first charge storage structure 150 may include the first and the second portion 154a and 154b spaced apart from each other in the second direction corresponding to single first channel 158. And thus, two charge storage sites VII and VII' spaced apart from each other may be formed in the second direction. The gate electrodes 212, 214 and 216 may be arranged to be spaced apart from each other in the second direction by the first and second channels 158 and 178 and the first and second charge storage structures 150. Therefore, additional insulation layer patterns for dividing the gate electrodes 212, 214, and 216 may not need to be formed. Therefore, a number of the charge storage sites may be formed in a given area.

Figure 5:
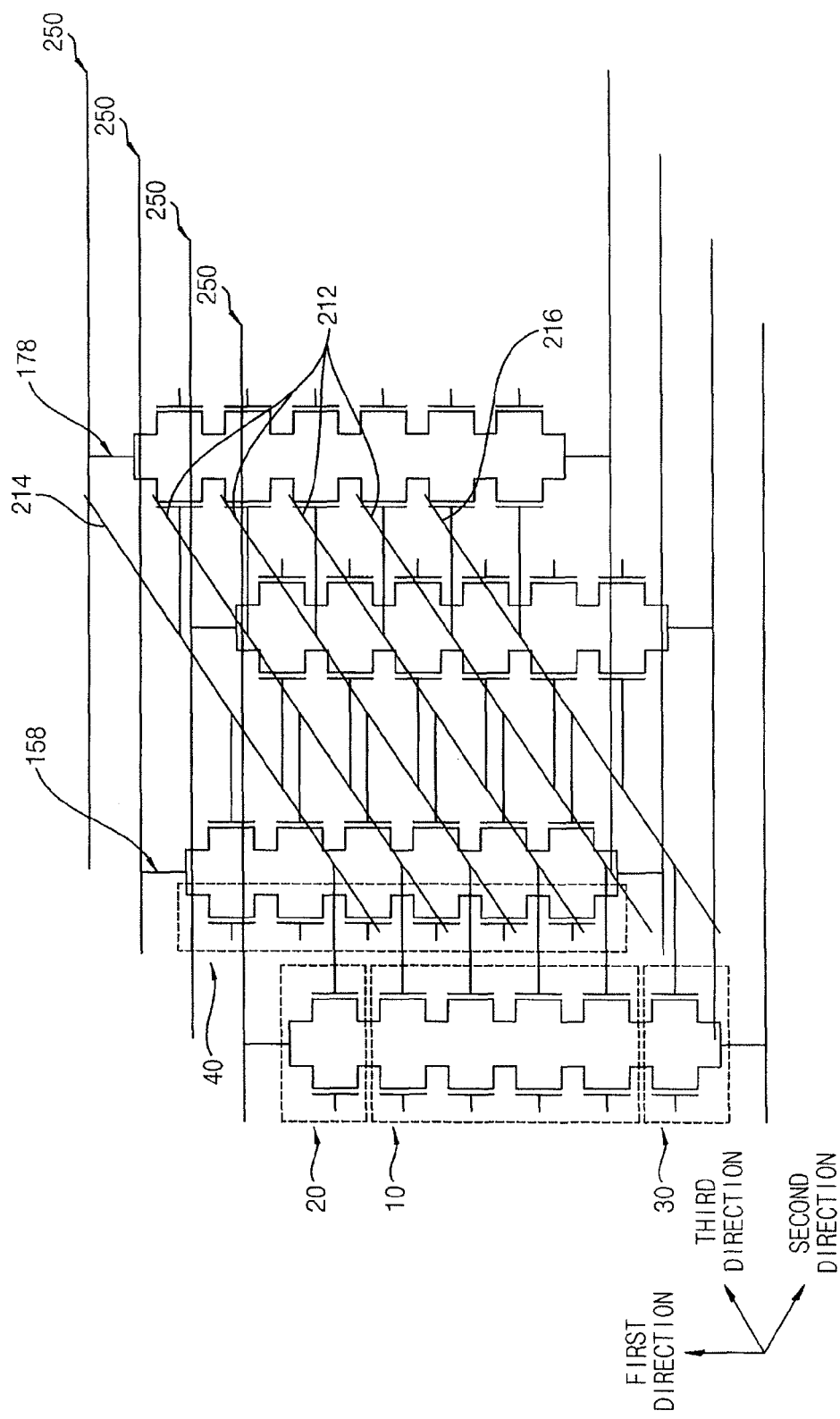
FIG. 5 illustrates an equivalent circuit diagram of the vertical memory device.

FIG. 5 illustrates an example of an equivalent circuit diagram illustrating a vertical memory device. Referring to FIG. 5 in view of FIGS. 1 to 4, a word line 212 and channels 158 and 178 according to example embodiments may define a memory cell 10. The SSL 214 and the channels 158 and 178 may define an upper non-memory cell 20, and GSL 216 and the channels 158 and 178 may define a lower non-memory cell 30.

A single cell string 40 may be formed to include the upper non-memory cell 20, the lower non-memory cell 30, and the plurality of memory cells 10 between them. Two cell strings 40 may be formed corresponding to one first channel 158, respectively. In other words, the cell strings 40 may be arranged to be spaced from each other in the second direction. In addition, two cell strings 40 may be electrically connected to one bit line 250.

The equivalent circuit diagram in the FIG. 5 may be applied not only to the vertical memory device illustrated with reference to the FIGS. 1 to 4, but also to the vertical memory devices illustrated in other example embodiments.

The plurality of word lines 212 may extend in the third direction and be spaced apart from each other in the first and second directions. Thus, a plurality of memory cells may be distributed three-dimensionally. The single word line 212 may define the memory cells 10 with the first channels 158 and 178 arranged in two columns different from each other. As illustrated above with reference to FIGS. 1 to 4, a single word line 212 may define the memory cells 10 with the first channels 158 of the first channel columns and may define the memory cells 10 with the second channels 178 of the second channel columns.

A plurality of SSL 214 may extend in the third direction, and be arranged in the second direction. Thus, one of the cell strings 40 connected to one bit line 250 may be selected by the upper non-memory cell including the SSL 214. The GSL 216 may control an electrical connection between the channels 158 and 178 and the substrate 100.

In a semiconductor device in accordance with the example embodiments, a program operation may be performed by setting a voltage difference between a selected word line 212 and a selected first channel 158 and injecting a charge in to a selected charge storage layer pattern 154. For example, a program voltage (Vprog) may be applied to the selected word line 212, and an electron may be transferred from the selected first channel 158 to the selected charge storage layer pattern 154 of the memory cell 10 by using Fowler-Nordheim tunneling (FN tunneling). The Vprog program voltage may inadvertently program a memory transistor included in an unselected word line 212. Therefore, an unintended program may be prevented by boosting technology. A read operation may be performed by setting a read voltage (Vread) to a selected word line 212 connected to the memory cell 10. As a result, charging a current to the bit line 250 may be determined in accordance with the threshold voltage (Vth) of the memory cell. Data information of the memory cell may be read by sensing the current of the bit line 250. In order to prevent a wrong reading due to the other memory cell sharing the word line 212 and channel 158, a negative voltage (Vneg) may be set to other word line 212 corresponding to another memory cell.

Erase operation may be performed as a block unit by using a gate induced drain leakage current (GIDL). For example, by applying an erase voltage (Verase) to the selected bit line 249 and the substrate 100, a potential of the first channel 158 may be raised. In this case, the rising of potential of the first channel 158 may be slightly delayed. The GIDL may be generated in the lower non-memory cell 30 corresponding to the GSL 216. Electrons formed by the GIDL may be released into the substrate 100, and holes may be released into the first channel 158. Therefore, the first channel 158 of the memory cell 10 may have the potential near the Verase. In this case, when the potential of the word line 212 is set to be 0 volt, electrons accumulated in the memory cell 10 may be released to erase the data. On the other hand, word line of the unselected block region may be floated to prevent unintended erase operation.

FIGS. 6 to 21 illustrate an embodiment of a method for manufacturing vertical memory device. FIG. 6A, FIG. 7A, FIG. 8A, FIG. 9A, FIG. 10A, FIG. 11A, FIG. 12A, FIG. 16A, FIG. 17A, FIG. 18A, FIG. 19, FIG. 20A and FIG. 21 illustrate perspective views of different stages of the manufacture of the vertical memory device, and FIG. FIG. 7B, FIG. 8B, FIG. 9B, FIG. 10B, FIG. 11B, FIG. 12B, FIG. 16B and FIG. 17B illustrate top views of these different stages. FIG. 16C is a local horizontal cross-sectional view corresponding to the method, and FIG. 6B, FIG. 8C, FIG. 18B illustrate side views corresponding to the method. FIG. 10C, FIG. 12C, FIG. 13, FIG. 14, FIG. 15, FIG. 16D and FIG. 20B illustrate vertical cross-sectional views of the semiconductor device in the perspective diagram cut along the line IV-IV'. The method may be used to manufacture a vertical memory device as shown in FIGS. 1 to 4, or a different memory device.

For the convenience of the explanation, FIGS. 6 to 21 do not show all elements of the semiconductor device. Particularly, a protection layer formed in a third region III of a substrate 100 and covering a first insulation layer 110 or a first insulation layer pattern 115 may be omitted.

Figure 6A:
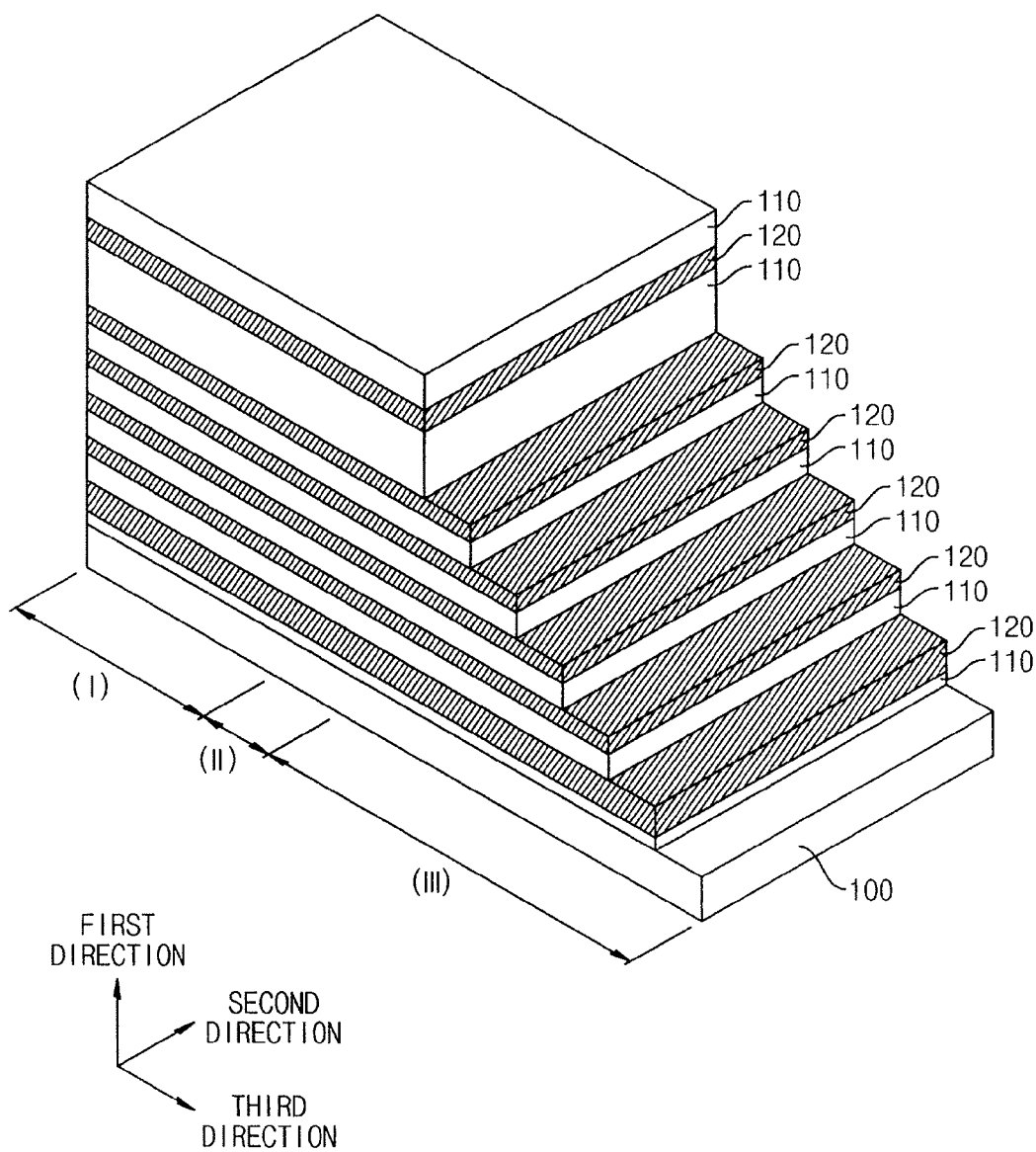
FIG. 6A, FIG. 7A, FIG. 8A, FIG. 9A, FIG. 10A, FIG. 11A, FIG. 12A, FIG. 16A, FIG. 17A, FIG. 18A, FIG. 19, FIG. 20A, and FIG. 21 illustrate perspective views of different stages of the manufacture of the vertical memory device.
Figure 6B:
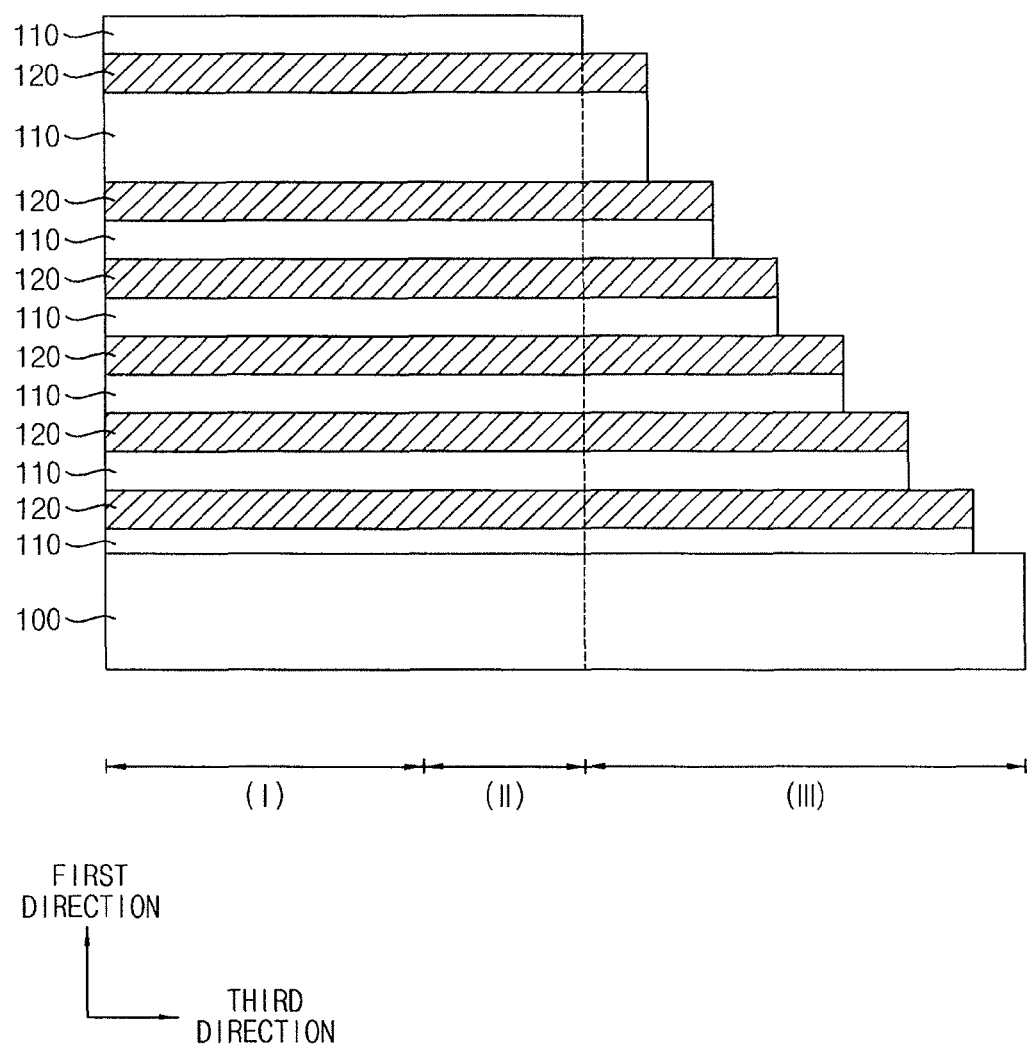
FIG. 6B, FIG. 8C, and FIG. 18B illustrate side views corresponding to the method.

Referring to FIGS. 6A and 6B, the first insulation layer 110 and a sacrificial layer 120 may be alternately and repeatedly formed on the substrate 100. A plurality of first insulation layers 110 and a plurality of sacrificial layers 120 may be alternately formed on each other at a plurality of levels in a first direction, respectively. The first direction is substantially perpendicular to a top surface of the substrate 100.

The substrate 100 may include a semiconductor material, for example, silicon and/or germanium. The substrate 100 may include a first region I, a second region II and a third region III. In example embodiments, the first region I may be a cell region at which a channels 158 (refer to FIG. 10A) may be formed. The third region III may be a connecting line region at which word line pads 230 (refer to FIG. 19) may be formed, and arranged to be space apart from the first region I along the third direction. The second region II may be located between the first region I and the third region III, and may be a dummy region at which a first and second dummy channel 158a and 178a (refer to FIG. 10A) located. The first and second dummy channel 158a and 178a may be illustrated hereafter.

In example embodiments, the first insulation layer 110 and the sacrificial layer 120 may be formed by, for example, a chemical vapor deposition (CVD) process, a plasma enhanced chemical vapor deposition (PECVD) process and/or an atomic layer deposition process (ALD) process. A lowermost first insulation layer 110, which may be formed directly on a top surface of the substrate 100, may be formed, for example, by a thermal oxidation process. In example embodiments, the first insulation layer 110 may be formed to include e.g., a silicon oxide. The sacrificial layer 120 may be formed to include, for example, a material with etch selectivity to the first insulation layer 110 (e.g., silicon nitride).

Figure 15:
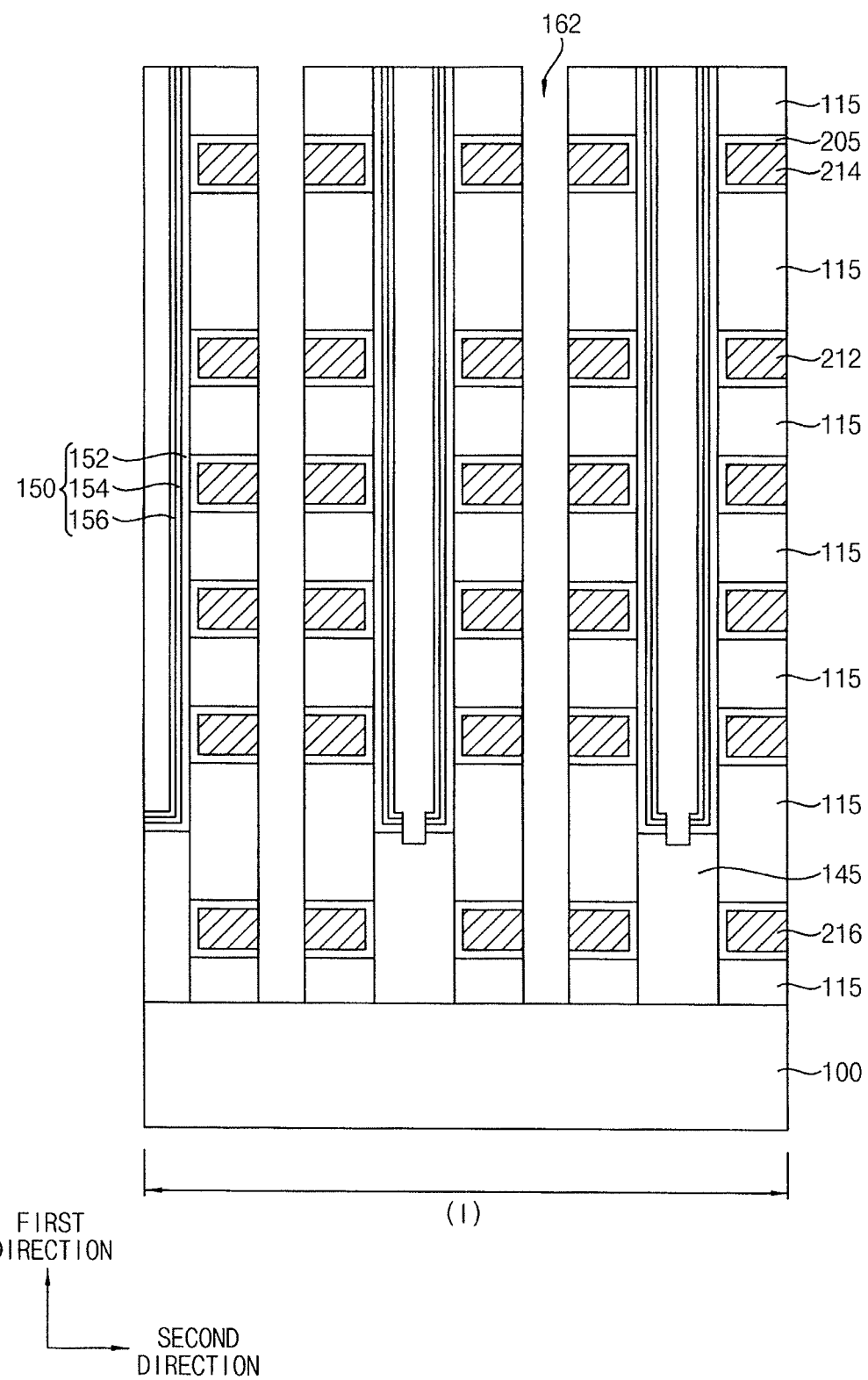
Figure 16A:
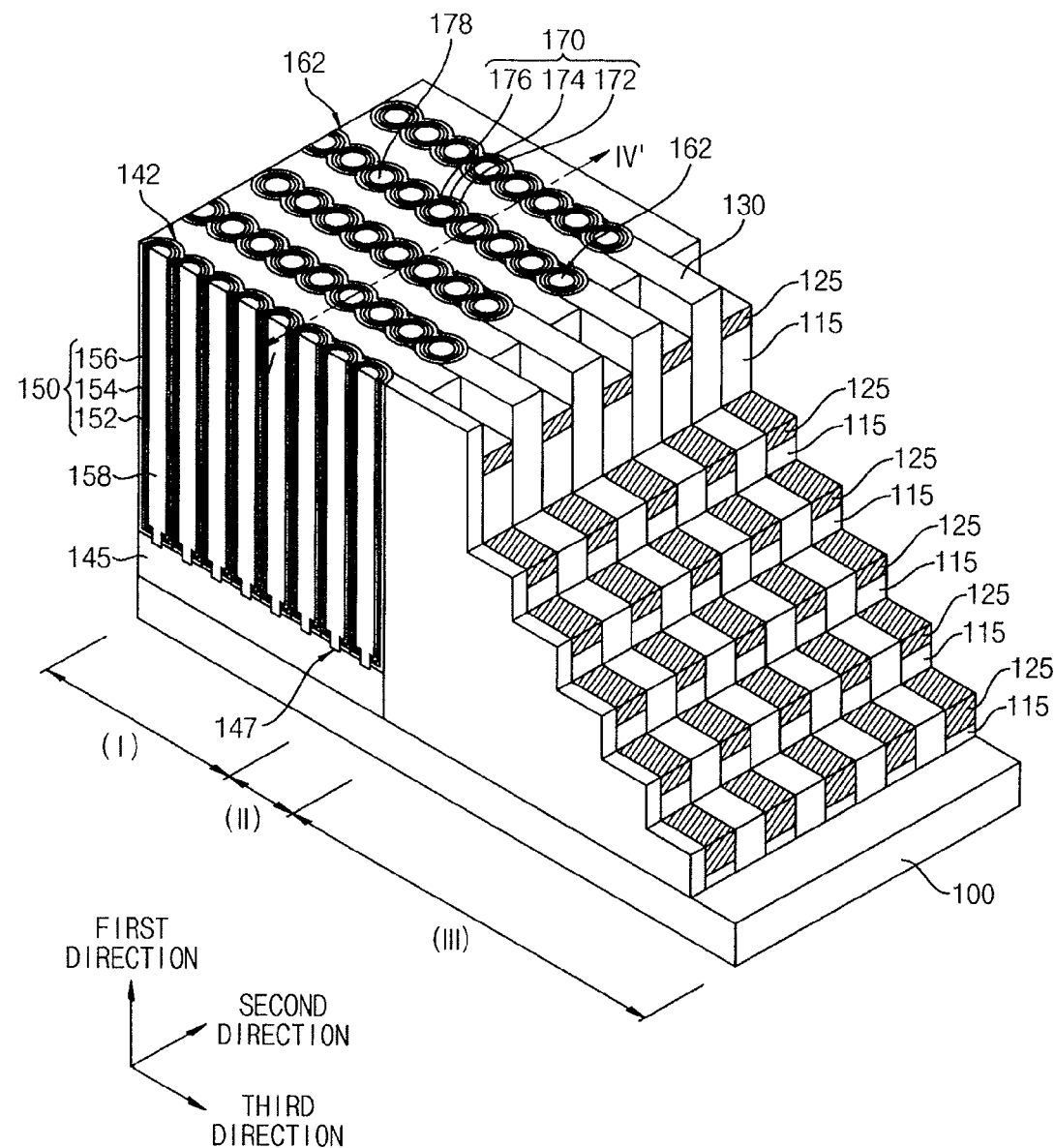
Figure 16B:
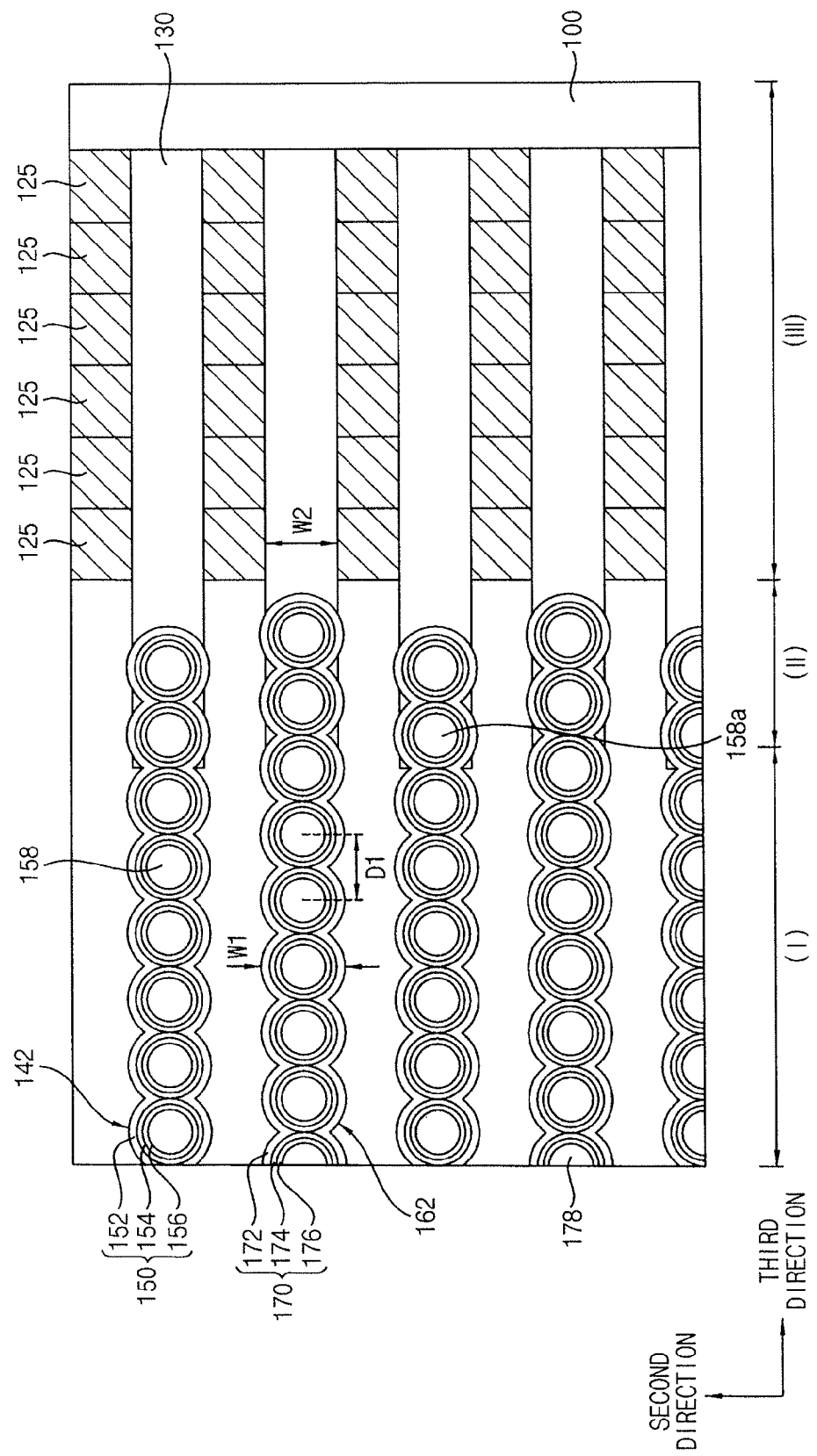
Figure 16C:
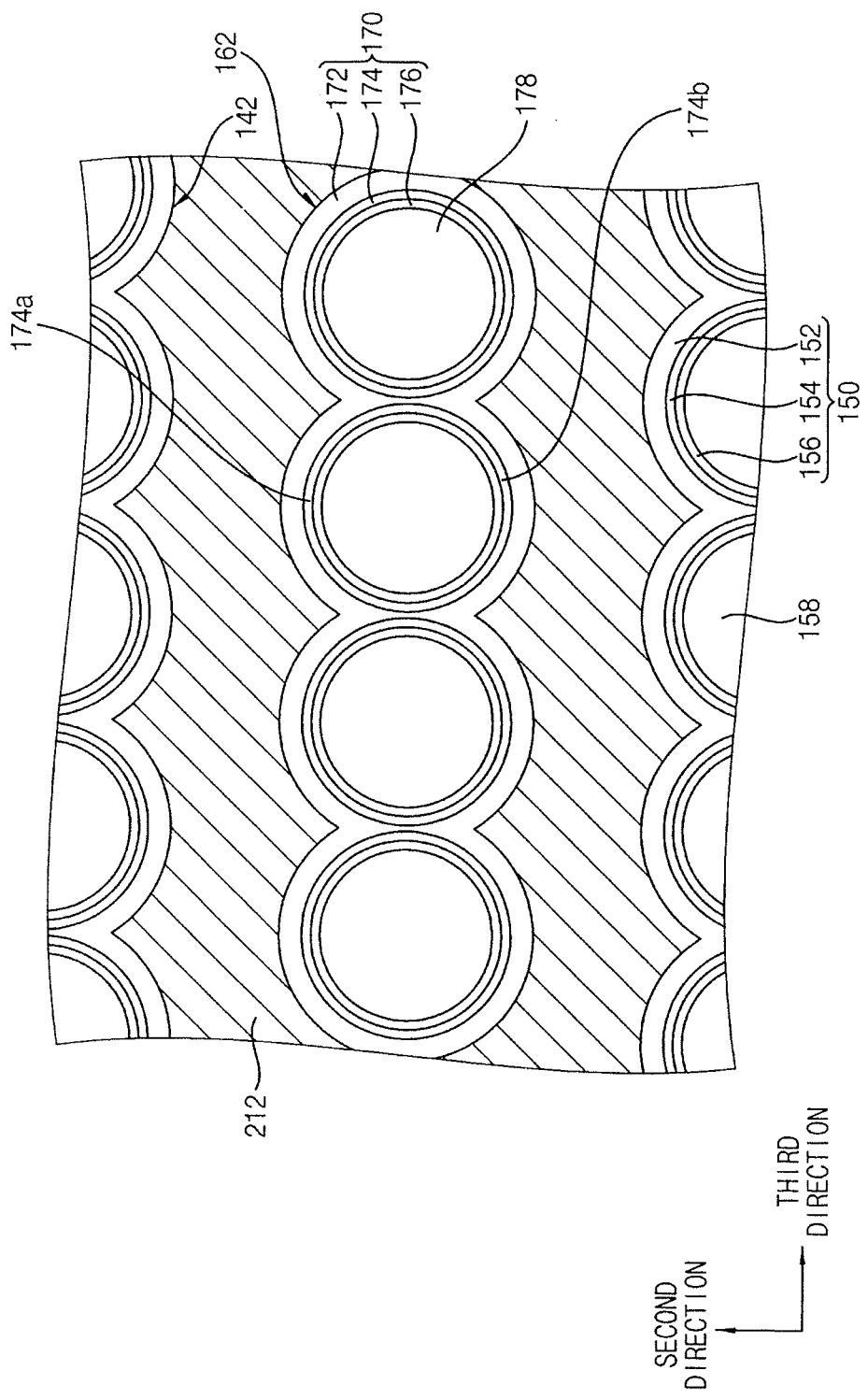
FIG. 16C illustrates a local horizontal cross-sectional view corresponding to the method.
Figure 16D:
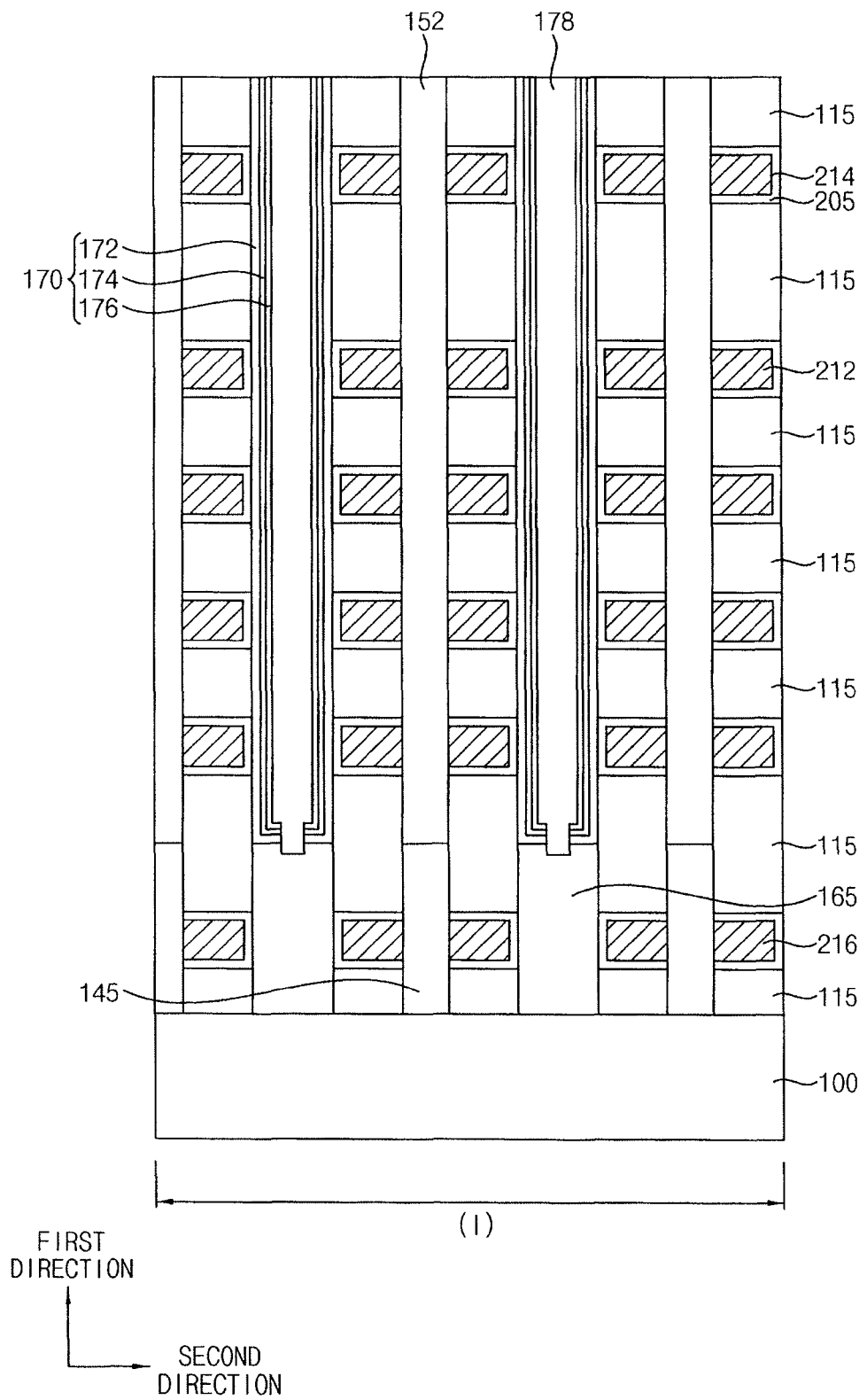

The number of the first insulation layers 110 and the number of the sacrificial layers 120 stacked on the substrate 100 may vary according to the desired number of a GSL 216(refer to FIG. 15), a word line 212 (refer to FIG. 15), and a SSL 214 (refer to FIG. 15). According to at least one example embodiment, each the GSL 216 and the SSL 214 may be formed at a single level and the word line 212 may be formed at 4 levels. In this case, the sacrificial layer 120 may be formed at 6 levels, and the first insulation layer 110 may be formed at 7 levels. However, the number of the first insulation layers 110 and the number of the sacrificial layers 120 may not be limited herein. For example, each of the GSL 216 and the SSL 214 may be formed at 2 levels, and the word line 212 may be formed at 2, 8, 16, 24, 32, or more levels. In this case, the number of the sacrificial layer 120 and the first insulation layers 110 may correspond thereto.

In example embodiments, the first insulation layer 110 and the sacrificial layer 120 may extend into the third region III from the first region I. Each of the first insulation layers 110 and the sacrificial layers 120 may extend in the third direction having lengths sequentially different from each other. The first insulation layer 110 at a lowermost level adjacent to a top surface of the substrate 100 may have a length longer than the first insulation layer 110 on an uppermost portion thereof. Thus, first insulation layer 110 and the sacrificial layer 120 may be arranged in a form of a pyramid in the third region III. A protection layer may be additionally formed to cover the first insulating layer 110 and the sacrificial layer 120 in the third region III.

Figure 7A:
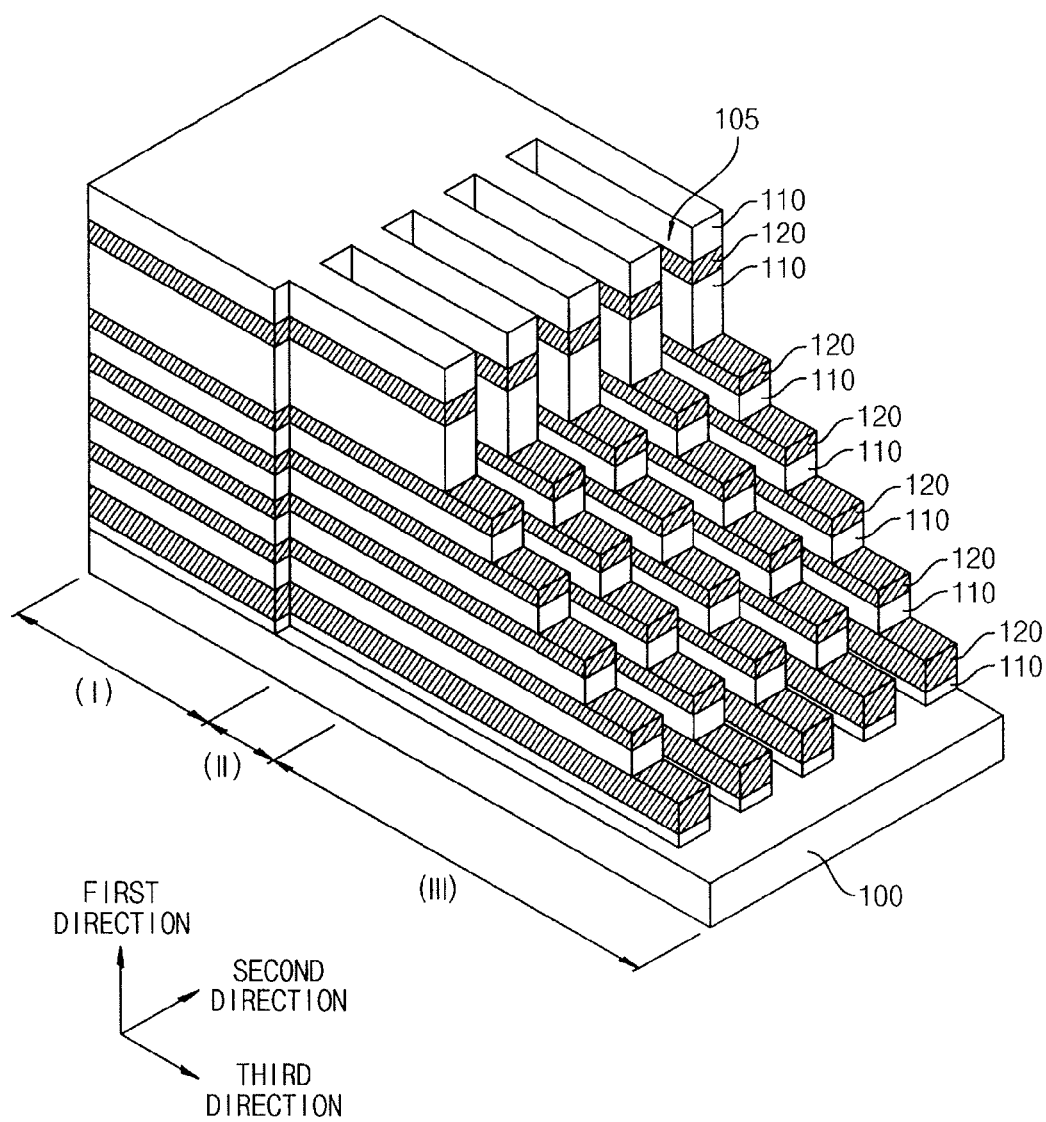

Referring to FIGS. 7a and 7b, the first insulation layer 110 and the sacrificial layer 120 may be partially removed to form a first opening 105 exposing the top surface of the substrate 100. Particularly, after forming a hard mask on the uppermost first insulation layer 110, the first insulation layers 110 and the sacrificial layers 120 may be dry etched using the hard mask to form the opening 105.

In example embodiments, a plurality of first openings 105 may be formed in the third direction, and each first opening 105 may extend in the third direction. The first openings 105 may be formed in the second and third regions II and III to expose the top surface of the substrate 100. Thus, a portion at which the first opening 105 formed and a portion at which the first insulation layer 110 and the sacrificial layer 120 formed may be alternately and repeatedly formed in the second and third regions II and III. In this case, each first opening 105 may have a second width w2 in the second direction.

In example embodiments, the hard mask may include a material having an etch selectivity with respect to silicon oxide and silicon nitride that may be included in the first insulation layers 110 and the sacrificial layers 120, e.g., polysilicon or amorphous silicon. The hard mask may be formed by a chemical vapor deposition (CVD) process, a plasma enhanced chemical vapor deposition (PECVD) process, an atomic layer deposition (ALD) process, and the like.

Figure 8A:
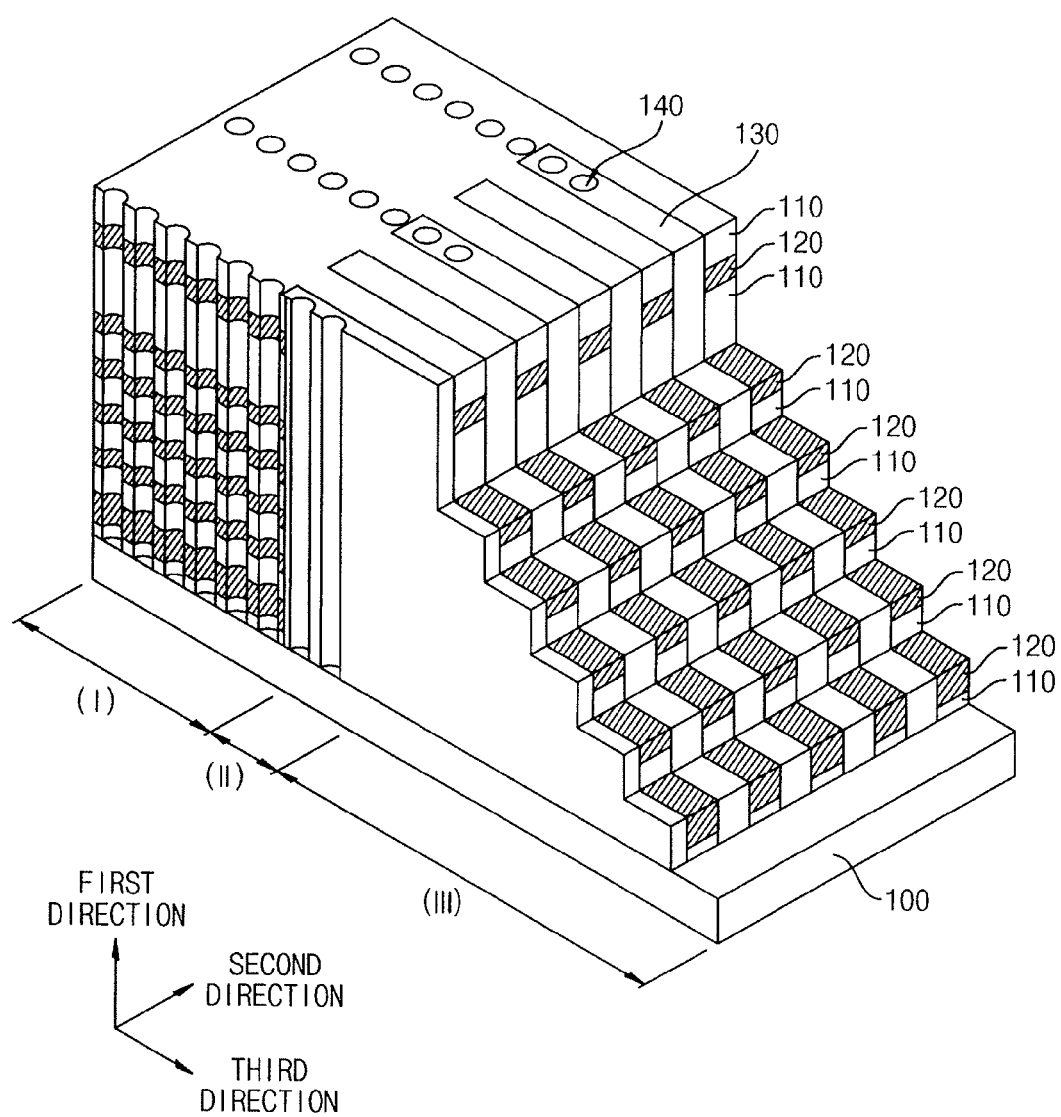
Figure 8B:
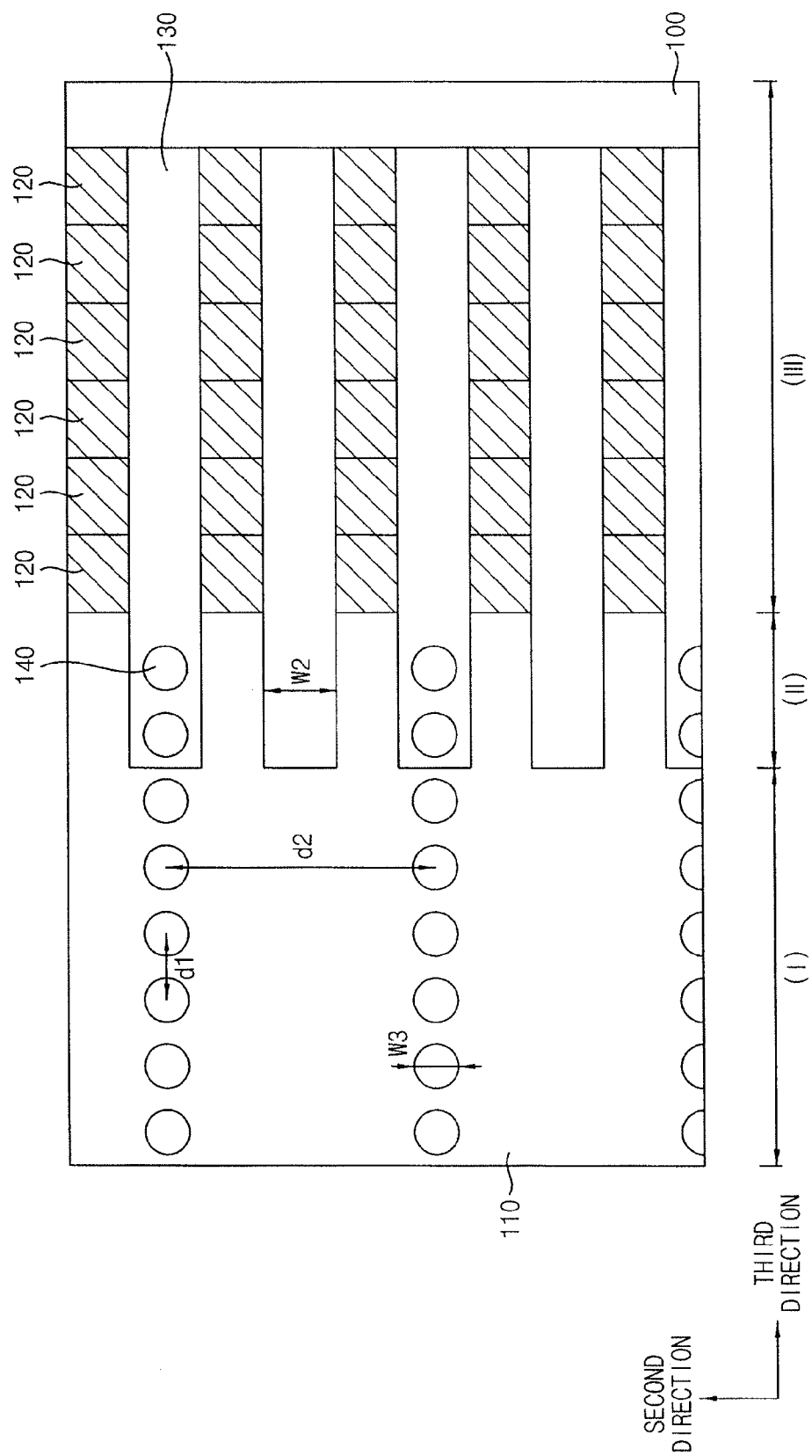
Figure 8C:
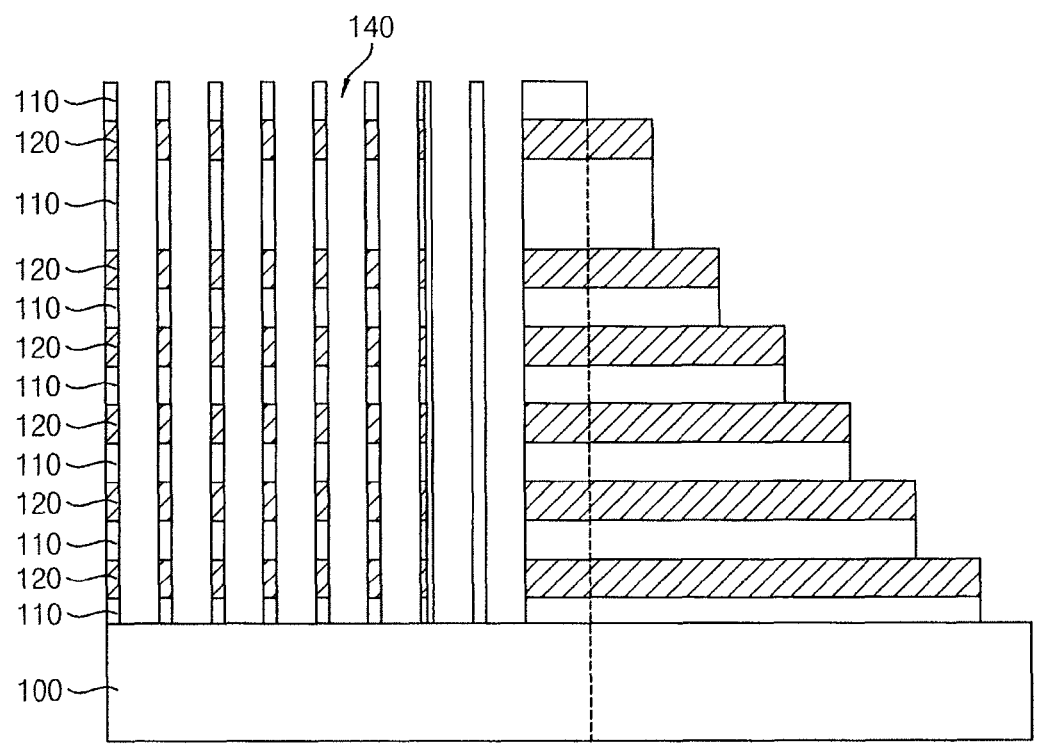

Referring to FIGS. 8a, 8b and 8c, after forming a second insulation layer pattern 130 to fill the first opening 105, a first preliminary hole 140 may be formed through the first insulation layer 110, the second insulation layer pattern 130 and the sacrificial layer 120.

After forming the second insulation layer filling the first opening 105 on the substrate 100 and the uppermost first insulation layer 110, an upper portion of the second insulation layer may be planarized to form the second insulation layer pattern 130. In example embodiments, the second insulation layer may be formed to include e.g., silicon oxide.

After forming hard masks on the uppermost first insulation layer 110, a dry etch process may be performed to form the first preliminary hole 140. Thus, the first preliminary hole 140 may be formed to extend in the first direction. Due to the characteristics of a dry etch process, the first preliminary holes 140 may have a tapered width e.g., a width that becomes gradually smaller from a top portion to a bottom portion thereof.

The first preliminary hole 140 may be formed through the first insulation layer 110 and the sacrificial layer 120 in the first region I, and may be formed through the second insulation layer pattern 130 in the second region II.

In example embodiments, a plurality of the first preliminary holes 140 may be arranged in the third direction to define a first preliminary hole column. A plurality of first preliminary hole columns may be arranged in the second direction.

Each center of the first preliminary holes 140 may be spaced apart from each other. A distance between the centers of the adjacent first preliminary holes 140 in the second direction may be a second distance d2. The distance between the centers of the adjacent first preliminary holes 140 in the third direction may be a first distance d1. In this case, the second distance d2 may be substantially larger than the first distance d1. Each of the first preliminary holes 140 may have a diameter substantially smaller than the second width w2 of the first openings 105.

Figure 9A:
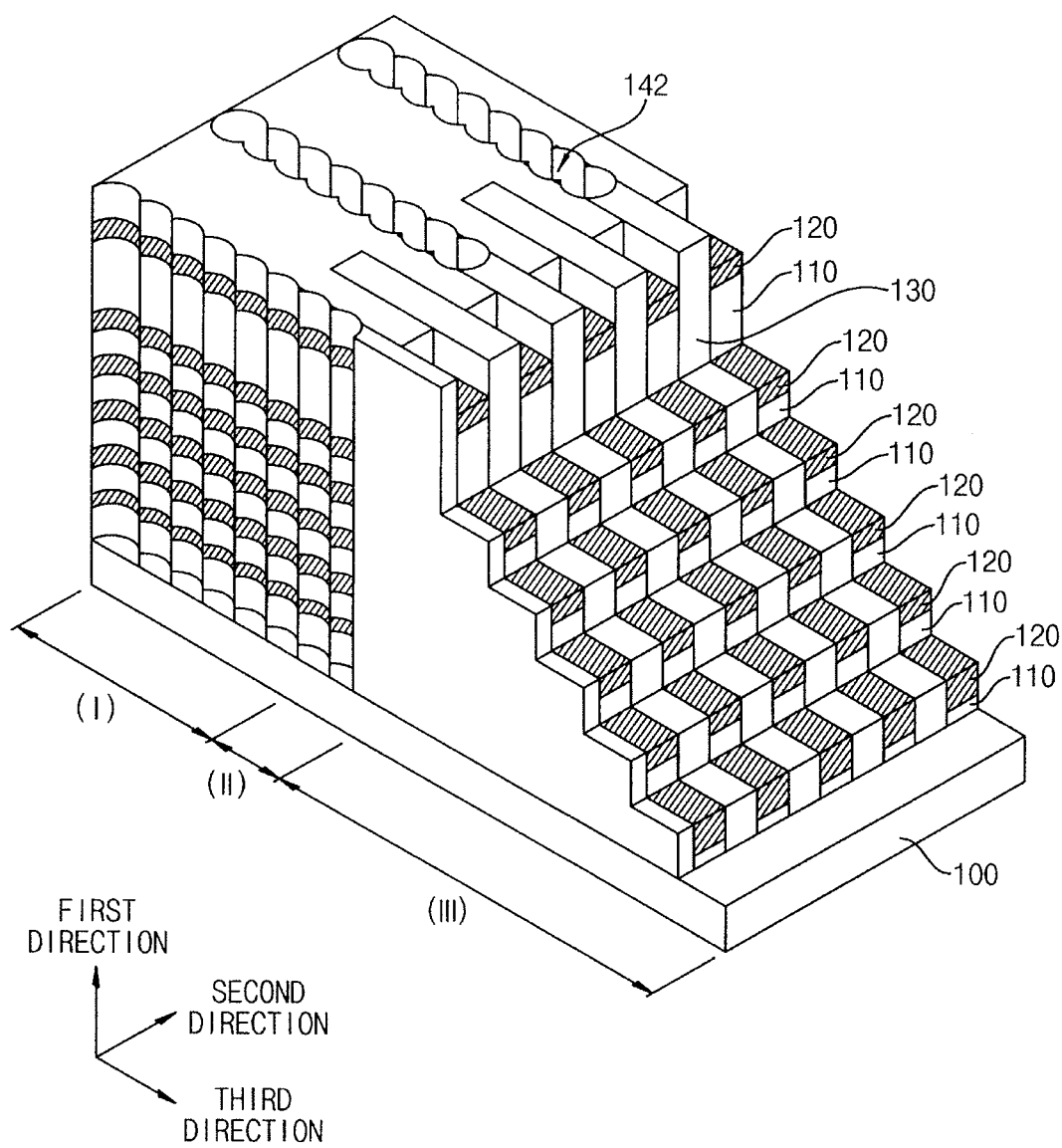

Referring to FIGS. 9a and 9b, the first preliminary holes 140 may be enlarged to form a first hole 142. Portions of the first insulation layers 110, the sacrificial layers 120 and the second insulation layer patterns 130 which are exposed by the first preliminary holes 140 may be removed to form the first hoe 142. The first insulation layers 110 and the second insulation layer patterns 130 may have a different etch selectivity from the sacrificial layers 120. Therefore, the first insulation layers 110 and the second insulation layer 130 may be partially etched. Then, the sacrificial layers 120 may be partially etched.

The diameters of the first preliminary holes 140 may be enlarged by an etch process. Thus, the first preliminary hole 140 arranged adjacent to each other in the third direction may be in fluid communication with each other to form the first hole 142. The first hole 142 may be disposed in the first region I and the second region II of the substrate 100, and may extend in the third direction. In example embodiments, a plurality of first holes 142 may be arranged in the second direction, and the center of the holes 142 may be spaced apart from each other having the second distance d2 in the second direction. The first hole 142 may have a first width w1 in the second direction, and the first width w1 may be substantially greater than the first distance d1.

Figure 10A:
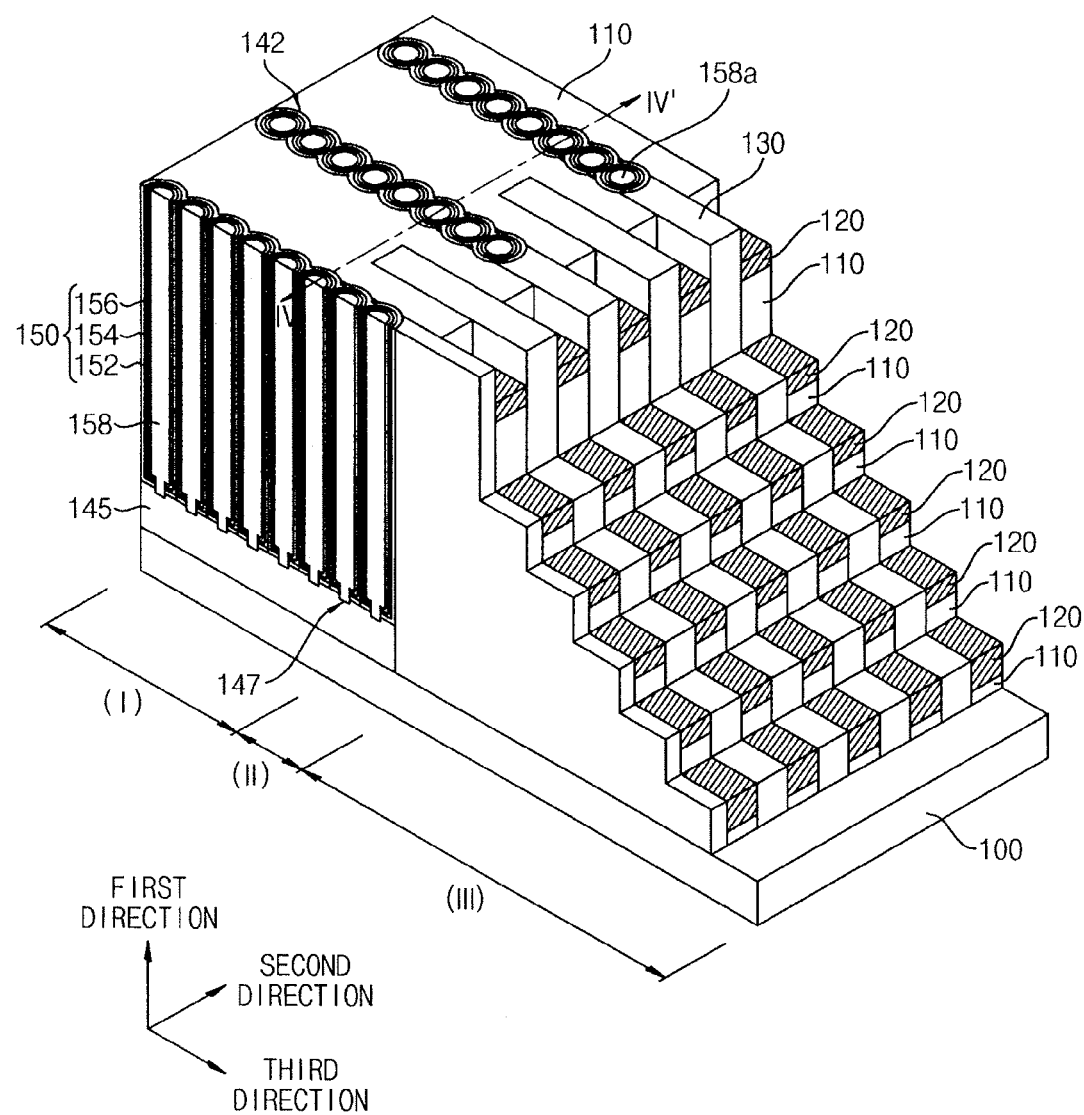
Figure 10C:
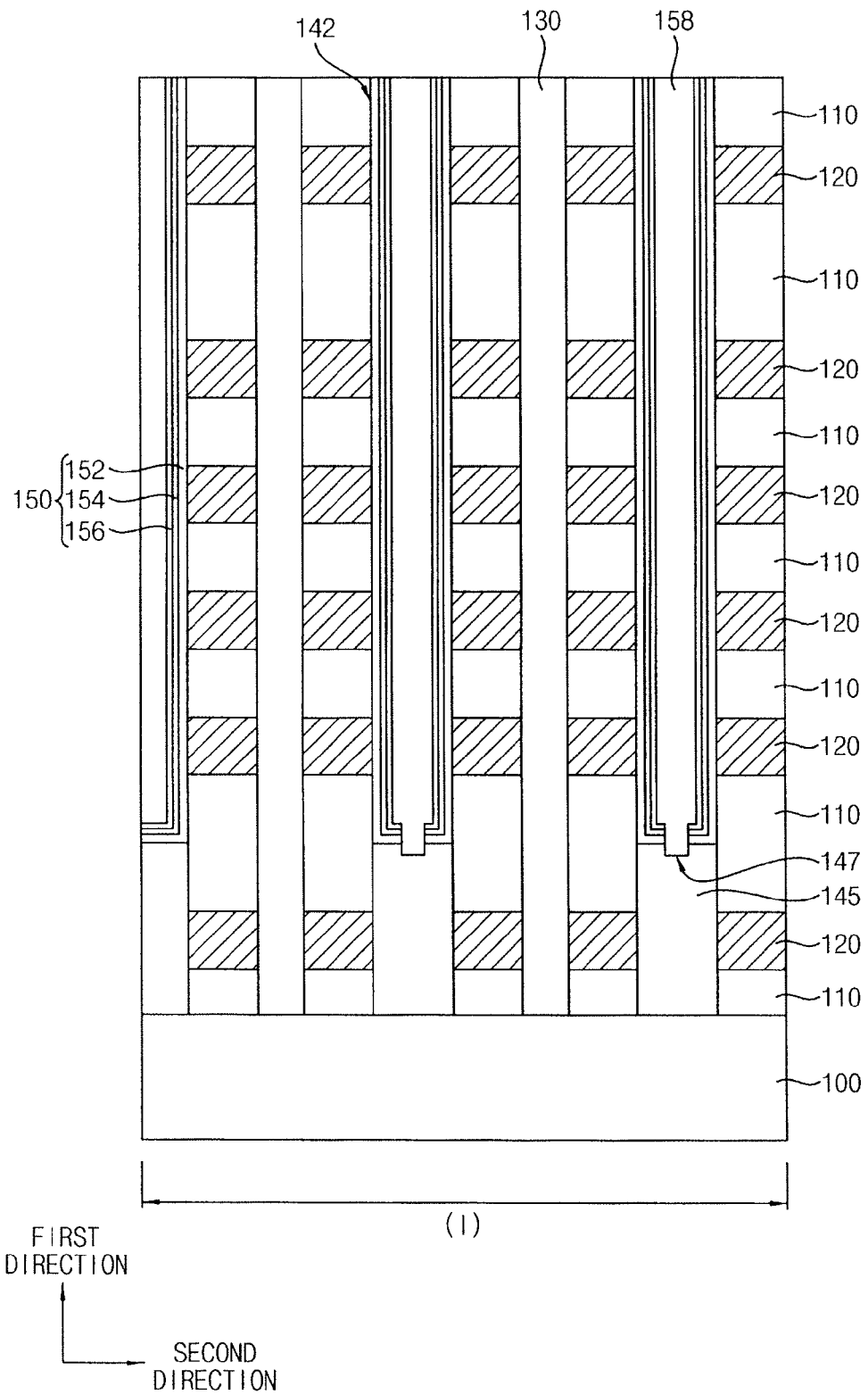

Referring to FIGS. 10a, 10b and 10c, a first semiconductor pattern 145 filling a lower portion of each first hole 142 may be formed. A plurality of first charge storage structures 150 and a plurality of the first channels 158 filling an upper portion of the first hole 142 may be formed on each first semiconductor pattern 145.

In example embodiments, a selective epitaxial growth (SEG) process may be performed using the exposed top surface of the substrate 100 by the first holes 142 as a seed to form the first semiconductor pattern 145 partially filling the first holes 142. Thus, the first semiconductor pattern 145 may be formed to include single crystalline silicon or single crystalline germanium according to the material of the substrate 100, and in some cases, impurities may be doped thereunto.

Alternatively, an amorphous silicon layer may be formed to fill the first holes 142, and a laser epitaxial growth (LEG) process or a solid phase epitaxial (SPE) process may be performed on the amorphous silicon layer to form the first semiconductor pattern 145. In example embodiments, the first semiconductor pattern 145 may be formed to have a top surface higher than that of the sacrificial layer 120 in which the GSL 216 may be formed subsequently.

Referring to FIG. 10c, a blocking layer, a charge storage layer, and a tunnel insulation layer may be sequentially formed on an inner wall of the first holes 142, a top surface of the uppermost layer of the semiconductor pattern 145, and a top surface of the first insulation layer 110. Bottom surfaces of the blocking layer, the charge storage layer, the tunnel insulation layer and an upper portion of the semiconductor pattern 145 may be partially removed to form a first recess 147, and a first channel 158 filling the rest portion of the first recess 147 and the first holes 142 may be formed. Thus, a first charge storage structure 150 including the first blocking layer pattern 152, the first charge storage layer pattern 154 and the first tunnel insulation layer pattern 156 may be formed.

A plurality of first channels 158 may be formed to be spaced apart from each other in the single first hole 142, and may define a first channel column. A plurality of first channel columns may be arranged in the second direction in accordance with the plurality of first holes 142 arranged in the second direction.

Additionally, the first channel 158 in the second region II may be defined as a first dummy channel 158a. The first dummy channels 158a may be substantially identical to the first channel 158 except that the first dummy channel 158a does not eclectically contact a bit line 250 which will be described subsequently.

A distance between centers of adjacent channels 158 in the third direction may be defined as a first distance d1. A width of the first charge storage structure 150 in the second direction may be defined as a first width w1. The first distance d1 may be substantially smaller than the first width w1. Thus, each of the first blocking layer patterns 152 and/or the first charge storage layer patterns 154 may partially overlap in the third direction.

In example embodiments, adjacent first blocking layer patterns 152 may be arranged to contact each other in the third direction. Thus, the first blocking layer patterns 152 may be formed to contiguously surround, as a whole, the plurality of first channels 158 included in each of the first channel columns. On the other hand, the first charge storage layer pattern 154 and the tunnel insulation layer pattern 156 around each channel 158 may be arranged to be spaced apart from each other in the third direction. The first charge storage layer patterns 154 and the first tunnel insulation layer patterns 156 corresponding to each of the first channels 158 may be arranged to be separated in the third direction by the first blocking layer patterns 152.

In example embodiments, the blocking layer may be formed to include an oxide, e.g., silicon oxide, the charge storage layer may be formed to include a nitride, e.g., silicon nitride, and the tunnel insulation layer may be formed to include an oxide, e.g., silicon oxide.

After forming the tunnel insulating layer, an auxiliary channel layer may be formed on the tunnel insulation layer. The auxiliary channel layer may prevent the tunnel insulation layer from being damaged when partially etching the charge storage layer.

In example embodiments, the auxiliary channel layer and the first channel 158 may be formed to include doped or undoped polysilicon or amorphous silicon. When the auxiliary channel layer and the first channel 158 are formed to include amorphous silicon, a crystallization process may be further performed.

Figure 11A:
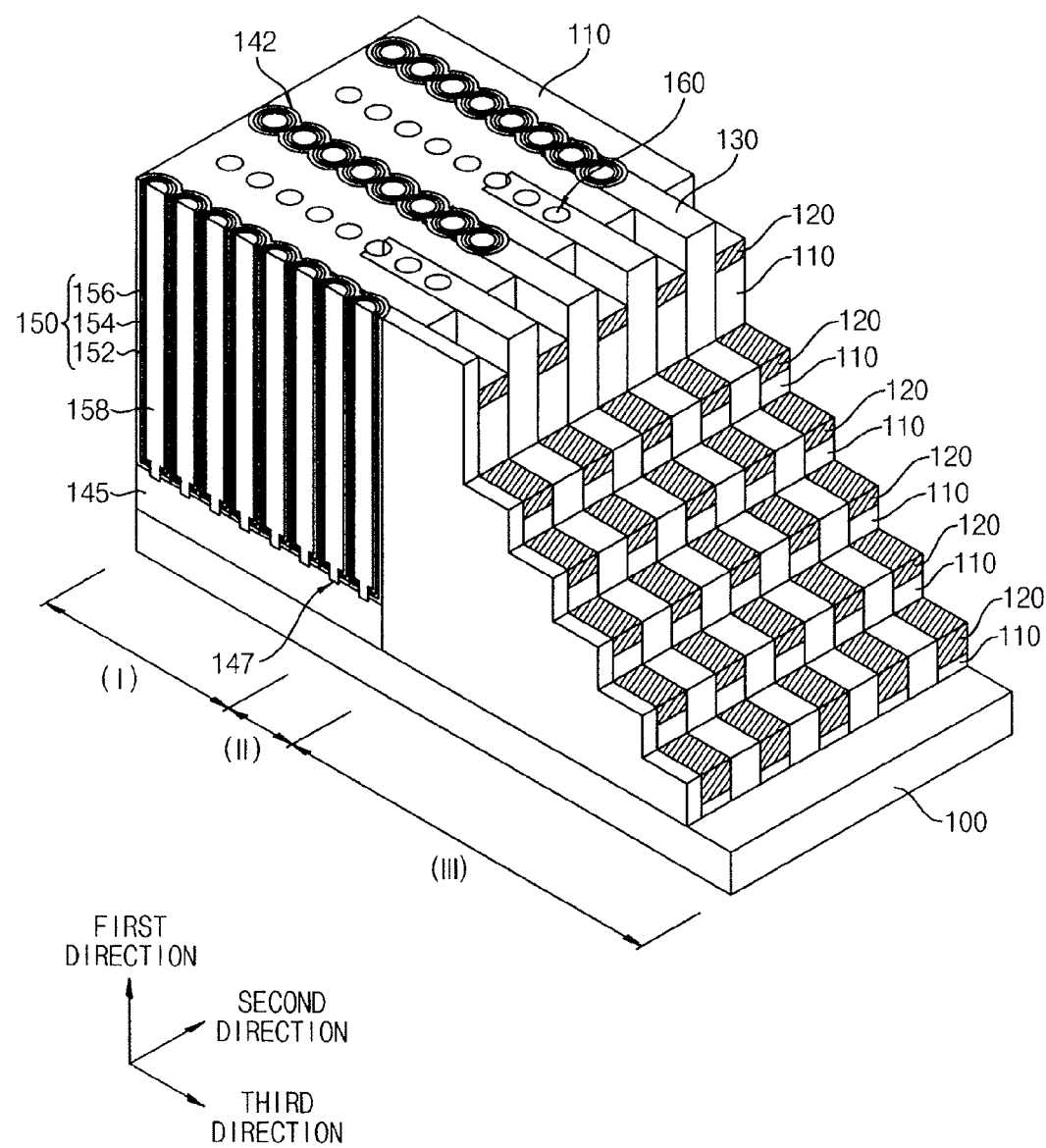

Referring to FIGS. 11a and 11b, a second preliminary hole 160 may be formed through the first insulation layer 110, the sacrificial layer 120 and the second insulation layer pattern 130.

Processes substantially the same as or similar to the process of forming the first preliminary hole 140 illustrated with reference to FIGS. 8a and 8b may be performed to form the second preliminary hole 160. The second preliminary hole 160 may be formed through the first insulation layers 110 and the sacrificial layers 120 in the first region I and may be formed through the second insulation layer pattern 130 in the second region II.

In example embodiments, a plurality of second preliminary holes 160 may be formed in the third direction to define a second preliminary hole column. In addition, a plurality of second preliminary hole columns may be arranged in the second direction.

The second preliminary hole 160 may be formed between the first preliminary holes 140 in the second direction. The first and second preliminary holes 140 and 160 may be arranged in a zigzag pattern with respect to the second direction. Thus, more first and second preliminary holes 140 and 160 may be arranged in a given area.

Figure 12A:
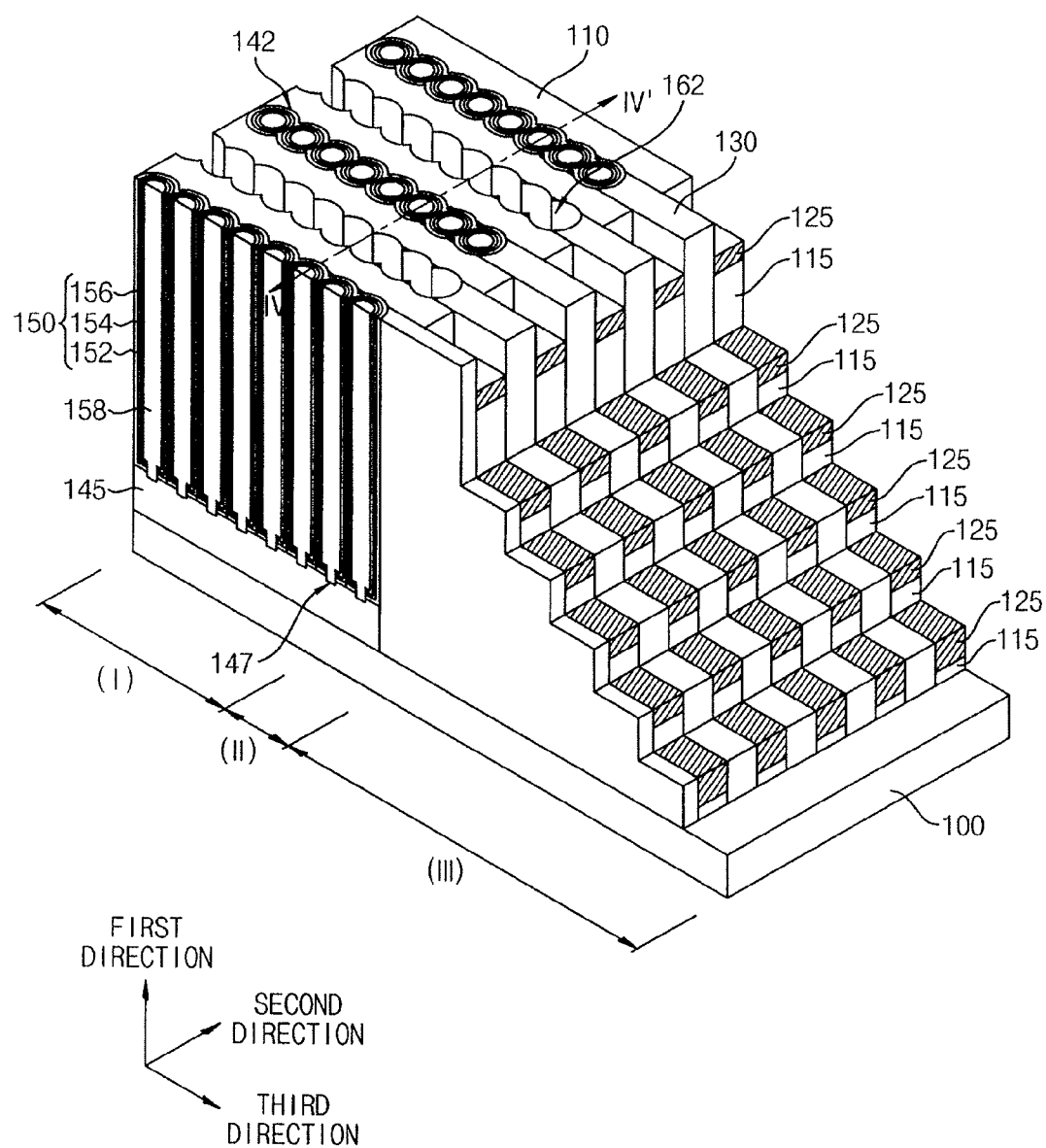
Figure 12B:
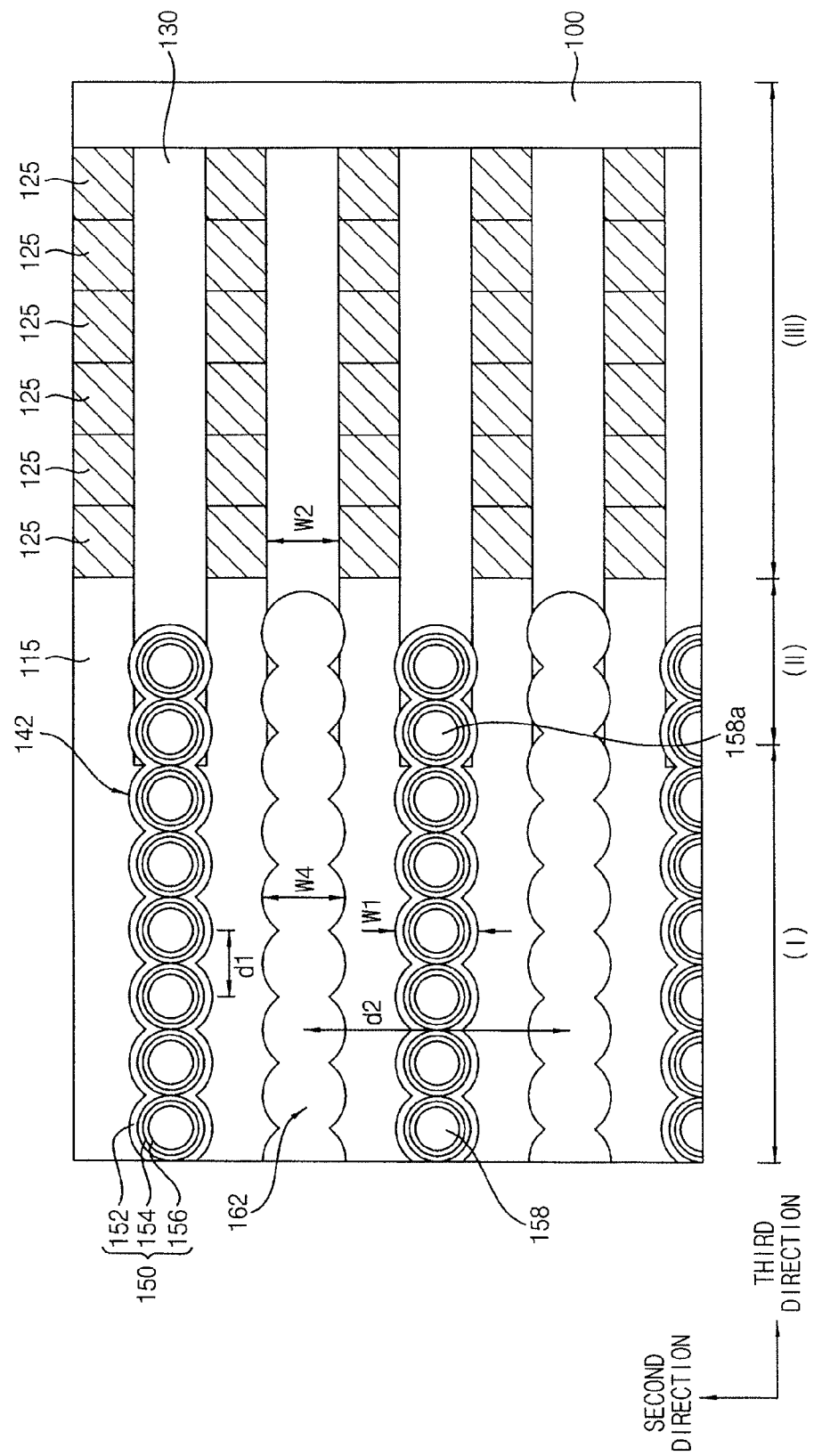

Referring to FIGS. 12a, 12b and 12c, the second preliminary hole 160 may be enlarged to form a second hole 162. Portions of the first insulation layers 110, the sacrificial layers 120, and the second insulation layer patterns 130 which are exposed by the second preliminary holes 160 may be removed to form the second hole 162. Processes substantially the same as or similar to the process of forming the first hole 142 illustrated with reference to FIGS. 10a, 10b and 10c may be performed to form the second hole 162.

The second preliminary holes 160 arranged to be adjacent to each other may be in fluid communication with each other to form the second hole 162. In this case, the second hole 162 may have a fourth width w4 in the second direction. The fourth width w4 may be substantially the same to or smaller than the first width w1.

The second hole 162 may be disposed in the first region I and the second region II of the substrate 100, and may extend in the third direction. In example embodiments, a plurality of second holes 162 may be formed along the second direction, and centers of the second holes 162 may be spaced apart from each other having the second distance d2 in the second direction.

The first insulation layers 110 and the sacrificial layers 120 may be changed into the first insulation layer patterns 115 and the sacrificial layer patterns 125, respectively. In this case, the first insulation layer patterns 115 and the sacrificial layer patterns 125 may be extended in the third direction and a plurality of those may be arranged in the second direction. The first insulation layer patterns 115 and the sacrificial layer patterns 125, at each level, may be arranged to be spaced apart from each other by the first hole 142 and the second hole 162.

Figure 13:
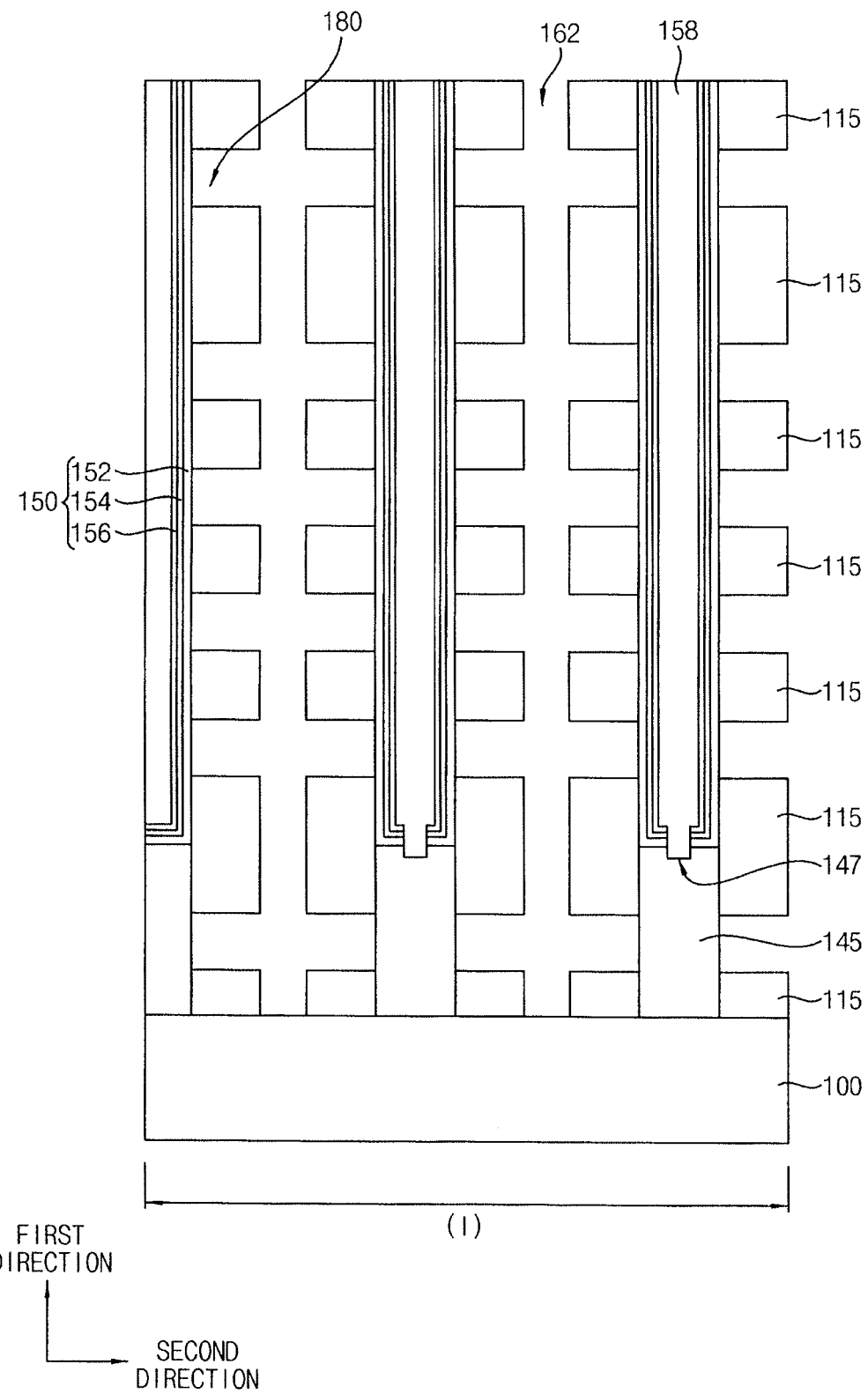

Referring to FIG. 13, the sacrificial layer patterns 125 may be removed to form first gaps 180 between the first insulation layer patterns 115 at each level. In example embodiments, the sacrificial layer patterns 125 exposed by the second holes 162 may be removed by, for example, a wet etch process using an etch solution including phosphoric acid and/or sulfuric acid. A portion of the sidewalls of the first blocking layer pattern 152 and the semiconductor pattern 145 may be exposed by each first gap 180.

By controlling the process condition during the etch process, the sacrificial layer patterns 125 in the first and second region I and II may be removed. However, the sacrificial layer patterns 125 on the third region III may not be removed.

Figure 14:
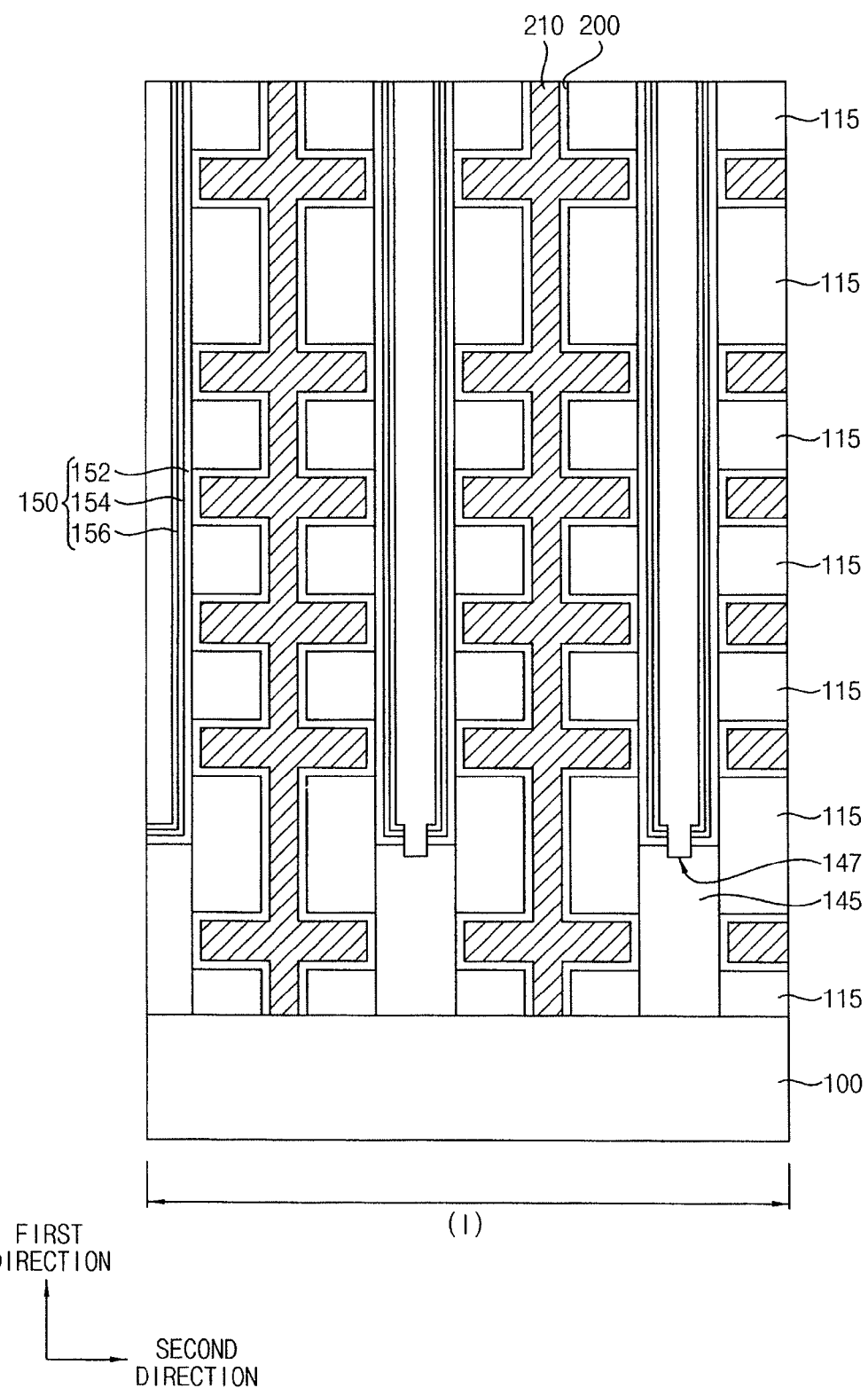

Referring to FIG. 14, an auxiliary blocking layer 200 may be formed on a side wall of the exposed first blocking layer pattern 152, a sidewall of the first semiconductor pattern, an inner wall of the first gap 180, an outer surface of the first insulation layer patterns 115, a exposed top surface of the substrate 100, a top surface of the first channel 158, and a top surface of the first charge storage structure 150. A gate electrode layer 210 may be formed on the auxiliary blocking layer 200 to sufficiently fill a remaining portion of the first gap 180.

In example embodiments, the auxiliary blocking layer 200 may be formed to include an insulating material e.g., aluminum oxide or silicon oxide. In an example embodiment, the auxiliary blocking layer 200 may be formed by a sequentially flow deposition (SFD) process or an ALD process.

In example embodiments, the gate electrode layer 210 may be formed to include a metal. For example, the gate electrode layer 210 may be formed to include a metal of a low resistance, e.g., tungsten, titanium, tantalum, platinum, and the like. When the gate electrode layer 210 is formed to include tungsten, the gate electrode layer 210 may be formed by a CVD process or an ALD process using tungsten hexafluoride (WF6) as a source gas.

Referring to FIG. 15, the gate electrode layer 210 may be partially removed to form gate electrodes 212, 214 and 216 in the first gap 180. In example embodiments, a wet etch process may be performed to partially remove the gate electrode layer 210. In example embodiments, the gate electrode 212, 214, and 216 may be formed to extend in the third direction, and the gate electrode 212, 214, and 216 may fill the first gap 180.

The gate electrode 212, 214 and 216 may include GSL 216, the word line 212 and the SSL 214 sequentially arranged from a top surface of the substrate 100 in the first direction. Each of the GSL 216, the word line 212 and the SSL 214 may be formed at a single level or at a plurality of levels. According to at least one example embodiment, each of the GSL 216 and the SSL 214 may be formed at a single level. The word line 212 may be formed at 4 (or another number of) levels between the GSL 216 and the SSL 214. A different number of GSLs 216, word lines 212 and SSLs 214 may be included in alternative embodiments. The GSL 216 may be formed adjacent to the first semiconductor pattern 145, and the word line 212 and the SSL 214 may be formed adjacent to the first channels 158.

When the gate electrode layer 210 is partially removed, portions of the auxiliary blocking layer 200 on a sidewall of the first insulation layer pattern 115 and the top surfaces of the substrate 100, the channel 158, and the first charge storage structure 150 may also be removed to form an auxiliary blocking layer pattern 205.

When the gate electrode layer 210 is partially removed, the fourth width w4 of the second hole 162 may be partially enlarged. Thus, the fourth width w4 of the second hole 162 may be substantially same to the first width w1 of the first hole 142.

Referring to FIGS. 16A, 16B, 16C and 16D, a second semiconductor pattern 165 may be formed to fill a lower portion of the second hole 162, and a second charge storage structure 170 and a second channel 178 filling an upper portion of the second hole 162 may be formed on the second semiconductor pattern 165.

Processes substantially the same as or similar to the process of forming the first semiconductor pattern 145, the first charge storage structure 150, and the first channel 158 illustrated with reference to FIGS. 10A, 10B and 10C may be performed to form the second semiconductor pattern 165, the second charge storage structure 170, and the second channel 178. The second charge storage structure 170 may be formed to include a second blocking layer pattern 172, a second charge storage layer pattern 174, and the second tunnel insulation layer pattern 176.

A distance between centers of the second channels 178 adjacent to each other in the third direction may be defined as a first distance d1. A width of the second charge storage structure 170 in the second direction may be defined as a first width w1. The first distance d1 may be substantially smaller than the first width w1. Thus, each of the second blocking layer patterns 172 and/or the second charge storage layer patterns 174 170 may partially overlap in the third direction.

In example embodiments, each of the second blocking layer patterns 172 may be arranged to contact each other in the third direction. Thus, the second blocking layer patterns 172 may be formed to contiguously surround, as a whole, the plurality of second channels 178 included in each of the second channel columns. On the other hand, each of the second charge storage layer patterns 174 and each of the second tunnel insulation layer patterns 176 may be arranged to be spaced apart from each other in the third direction. Each of the second charge storage layer patterns 174 and the second tunnel insulation layer patterns 176 corresponding to each of the second channels 178 may be arranged to be separated in the third direction by the second blocking layer patterns 172.

The second charge storage layer pattern 174 may include a first portion 174a and a second portion 174b that are spaced apart from each other in the second direction. Thus, two charge storage sites may be located in the second direction corresponding to the single second channel 178. In other words, the second channel 178, the second tunnel insulation layer pattern 176, the first portion 174a of the second charge storage layer pattern 174, the second blocking layer pattern 172, and the word line 212 may define one memory cell unit. The second channel 178, the second tunnel insulation layer pattern 176, the second portion 174b of the second charge storage layer pattern 174, the second blocking layer pattern 172, and the word line 212 may define other memory cell unit. In other words, a plurality of charge storage sites may be provided for each channel.

Figure 17A:
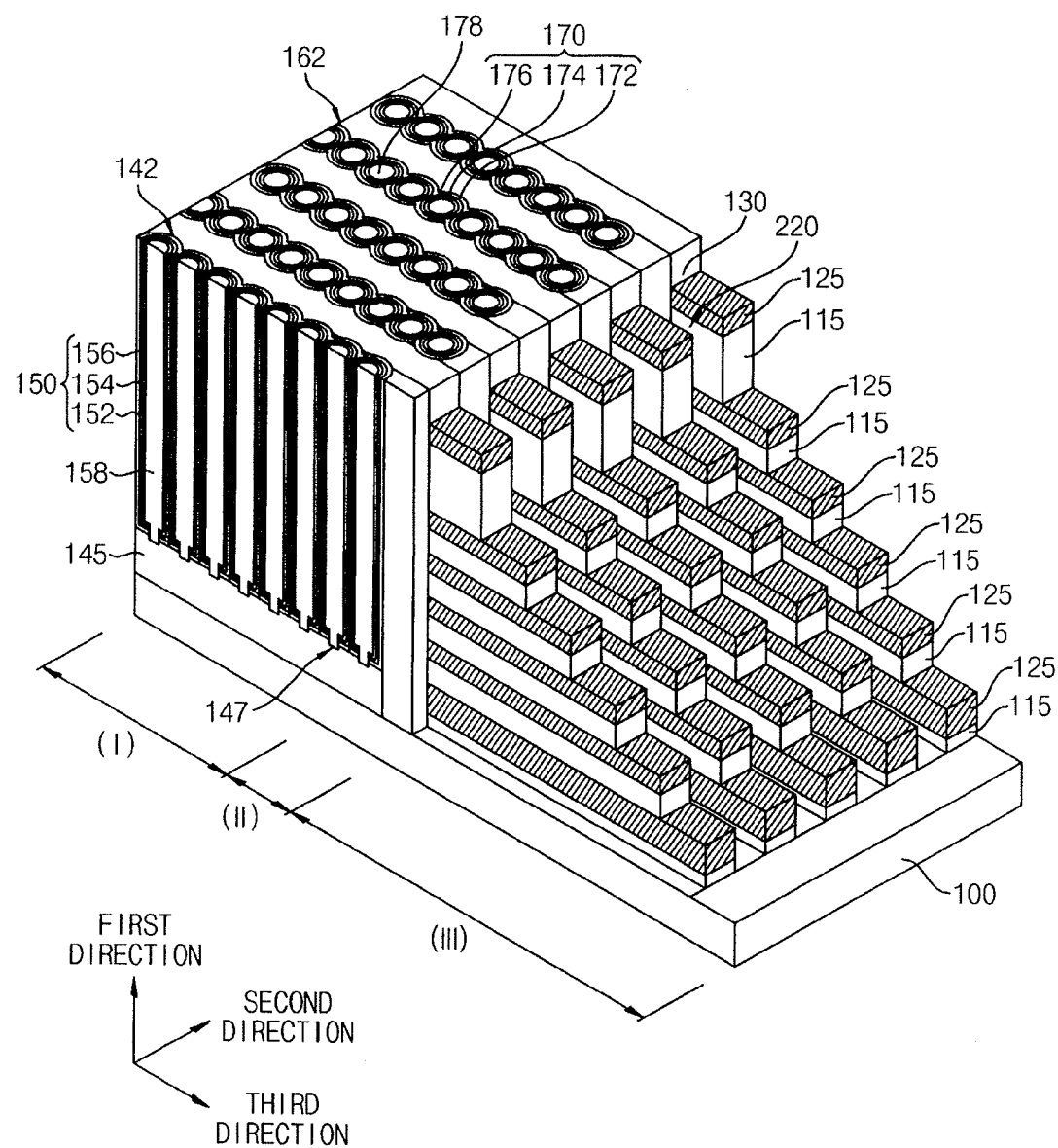
Figure 17B:
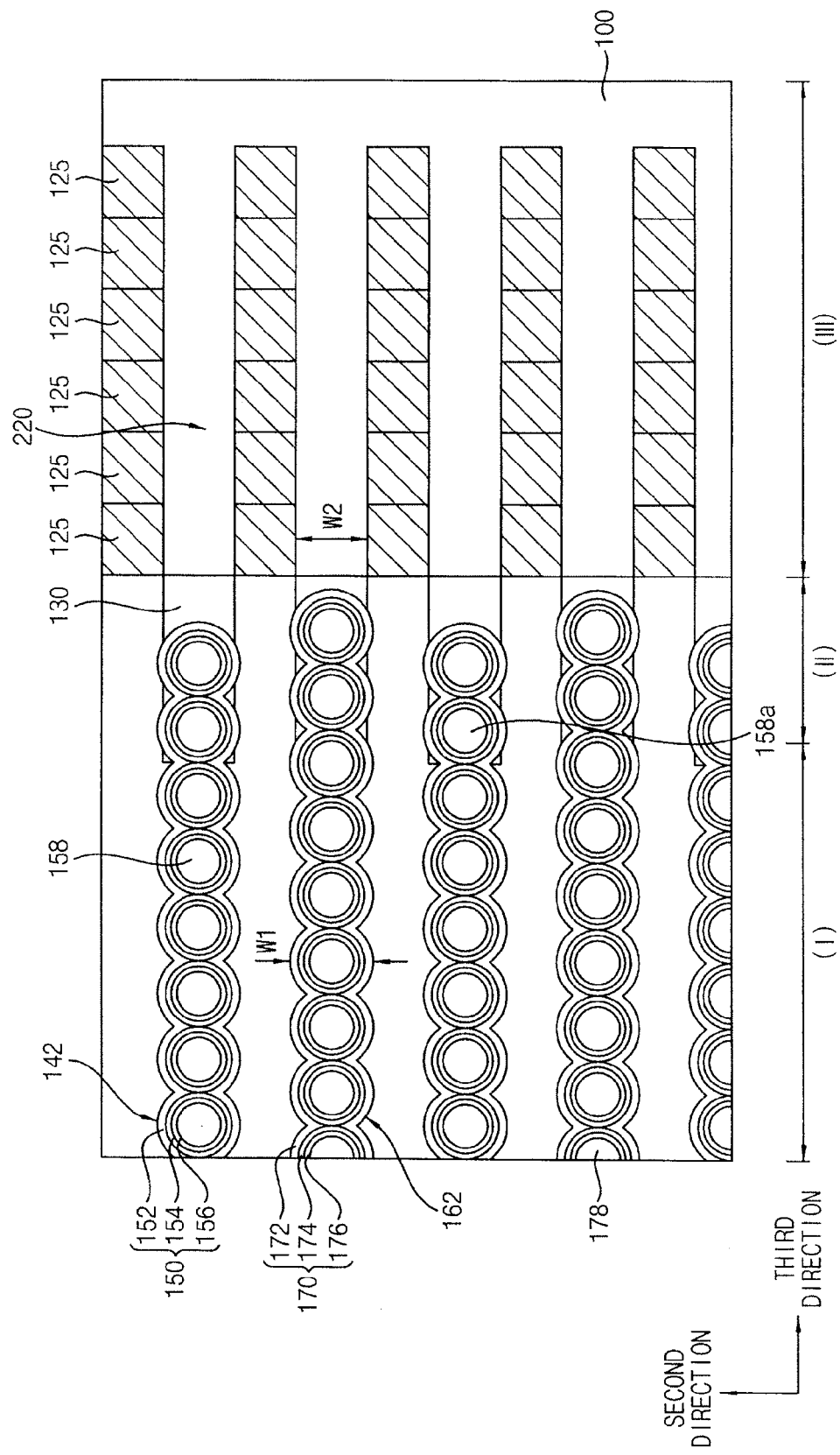

Referring to FIGS. 17A and 17B, the second insulation layer pattern 130 may be partially removed to form a second opening 220 exposing the top surface of the substrate 100.

Processes substantially the same as or similar to the process of forming the first opening 105 illustrated with reference to FIGS. 7A and 7B may be performed to form the second opening 220. However, the second opening 220 may exposed only a top surface of the substrate 100 in the third region III. Thus, a portion at which the second opening 220 is disposed and a portion at which the first insulation layer patterns 115 and the sacrificial layer patterns 125 are disposed may be alternately and repeatedly formed in the second direction.

Figure 18A:
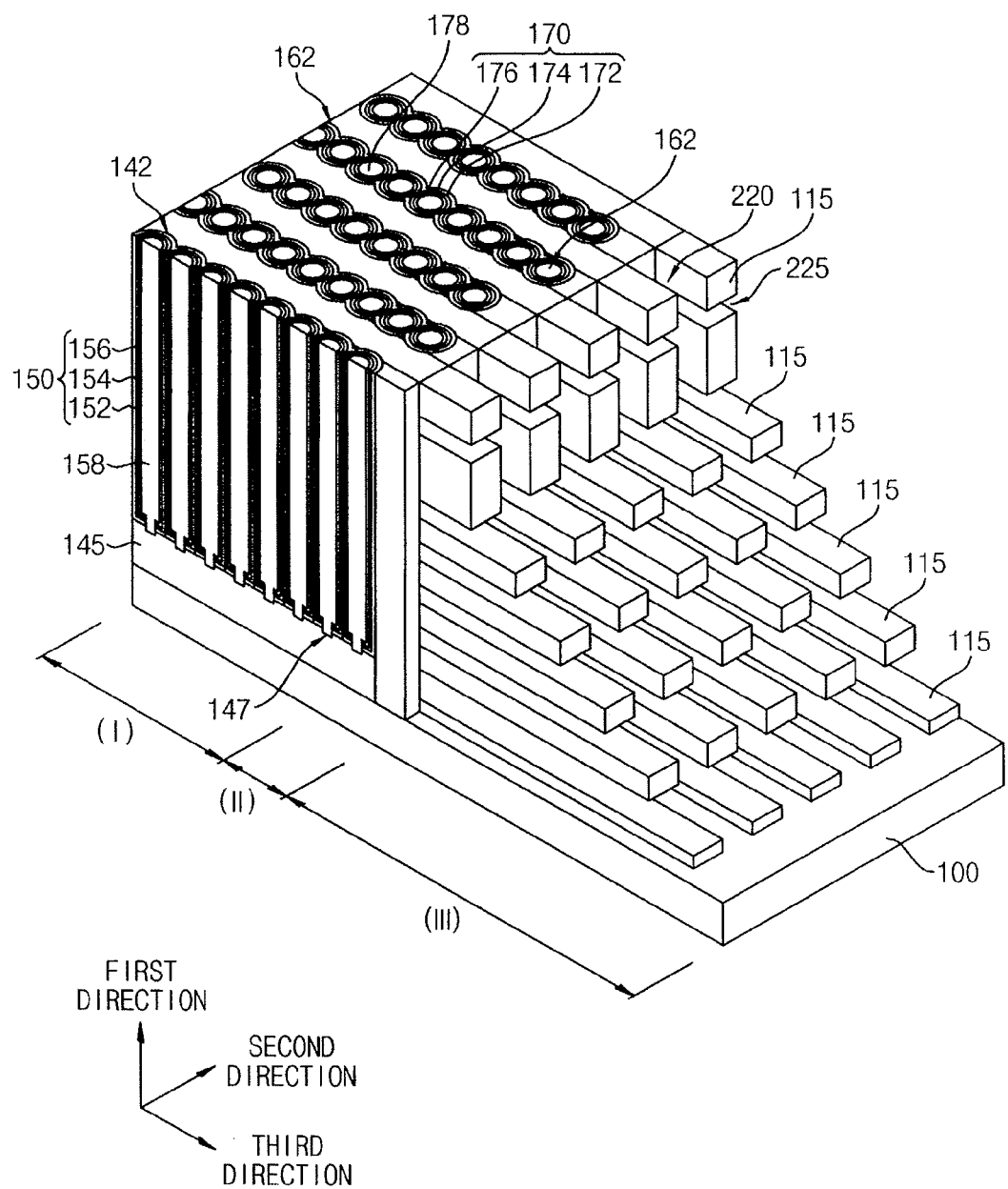
Figure 18B:
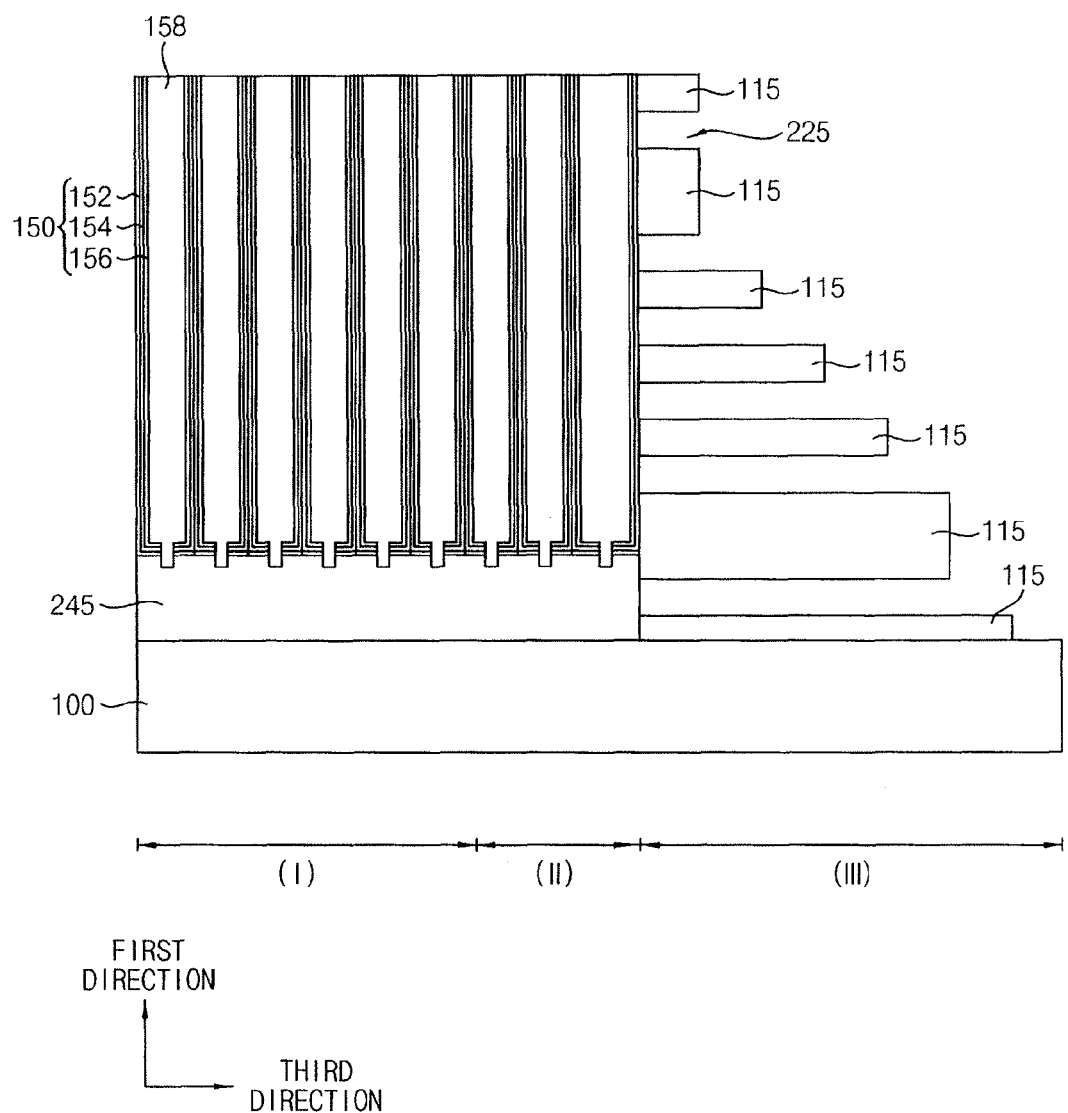

Referring to FIGS. 18A and 18B, the sacrificial layer patterns 125 in the third region III may be removed to form the second gap 225 between the first insulation layer patterns 115 at each level. In example embodiments, the sacrificial layer patterns 125 exposed by the second openings 220 may be removed by, for example, a wet etch process using an etch solution including phosphoric acid and/or sulfuric acid. A portion of the sidewalls of the gate electrodes 212, 214, and 216 and the semiconductor patterns 145 and 165 may be exposed by second gap 225.

The etch process may remove the sacrificial layer patterns 125 in the third region III. However, the dummy channels 158a and 178a and the second insulation layer pattern 130 may be formed on the second region II. Thus, damage on a memory cell of the vertical memory device in the first region I may be prevented.

Figure 19:
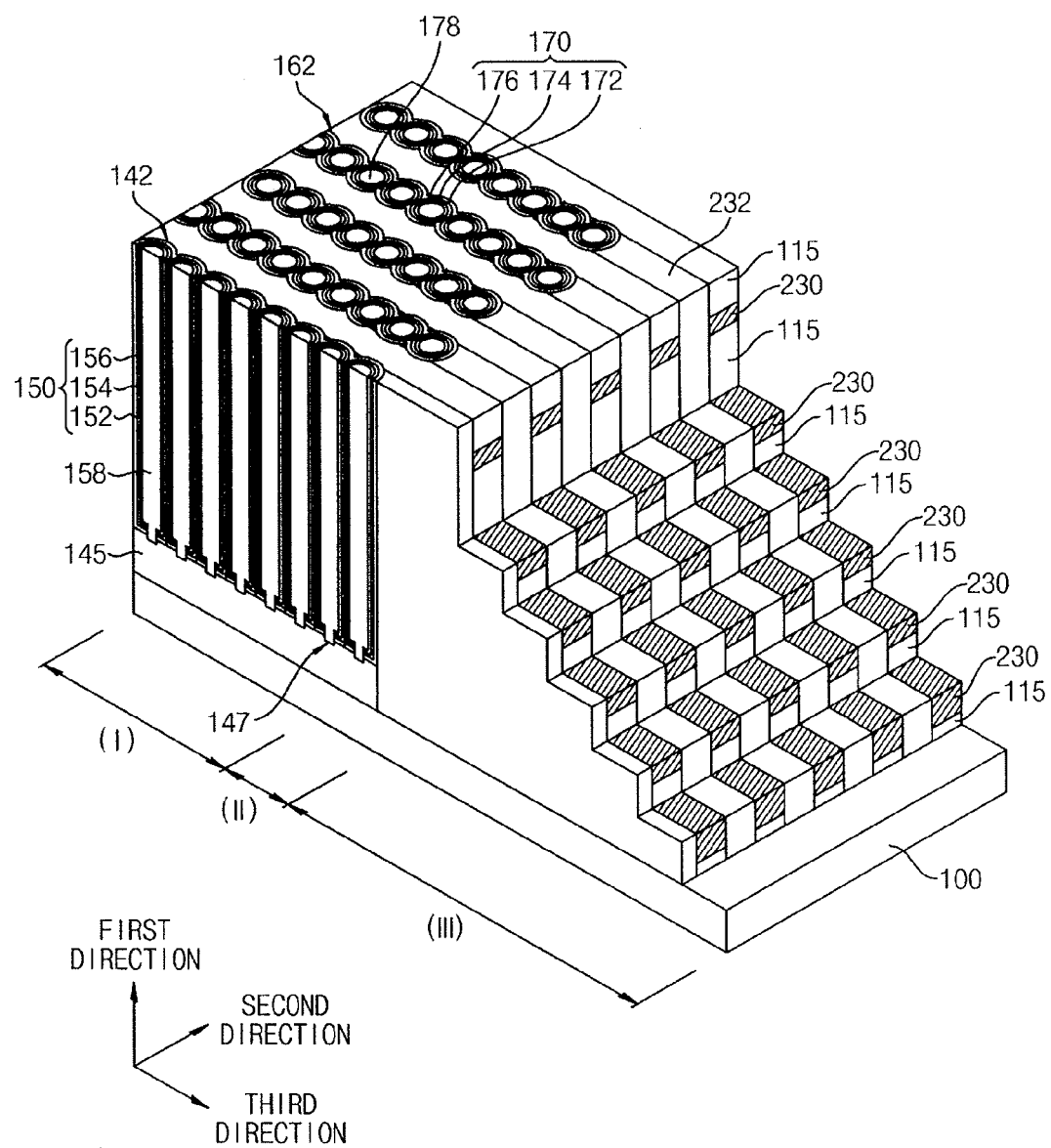

Referring to FIG. 19, an word line pad layer may be formed on an outer sidewall of the exposed gate electrode 212, 214, and 216, a side wall of the exposed semiconductor patterns 145 and 165, an inner wall of the second gap 225, a surface of the first insulation layer pattern 115, and a top surface of the exposed substrate 100. The word line pad layer may be partially removed to form a word line pad 230 in the second gap 225.

In example embodiments, the word line pad 230 may be formed to include a metal of a low electrical resistance (e.g., tungsten, tungsten nitride, titanium, and/or platinum).

In example embodiments, the word line pads 230 may be spaced apart from each other in the first direction, and a plurality of word line pads 230 may be arranged in the second direction. Each of the word line pads 230 may be electrically connected to the gate electrodes 212, 214, and 216. In example embodiments, the second opening 220 may be filled with the third insulation layer pattern 232.

Figure 20A:
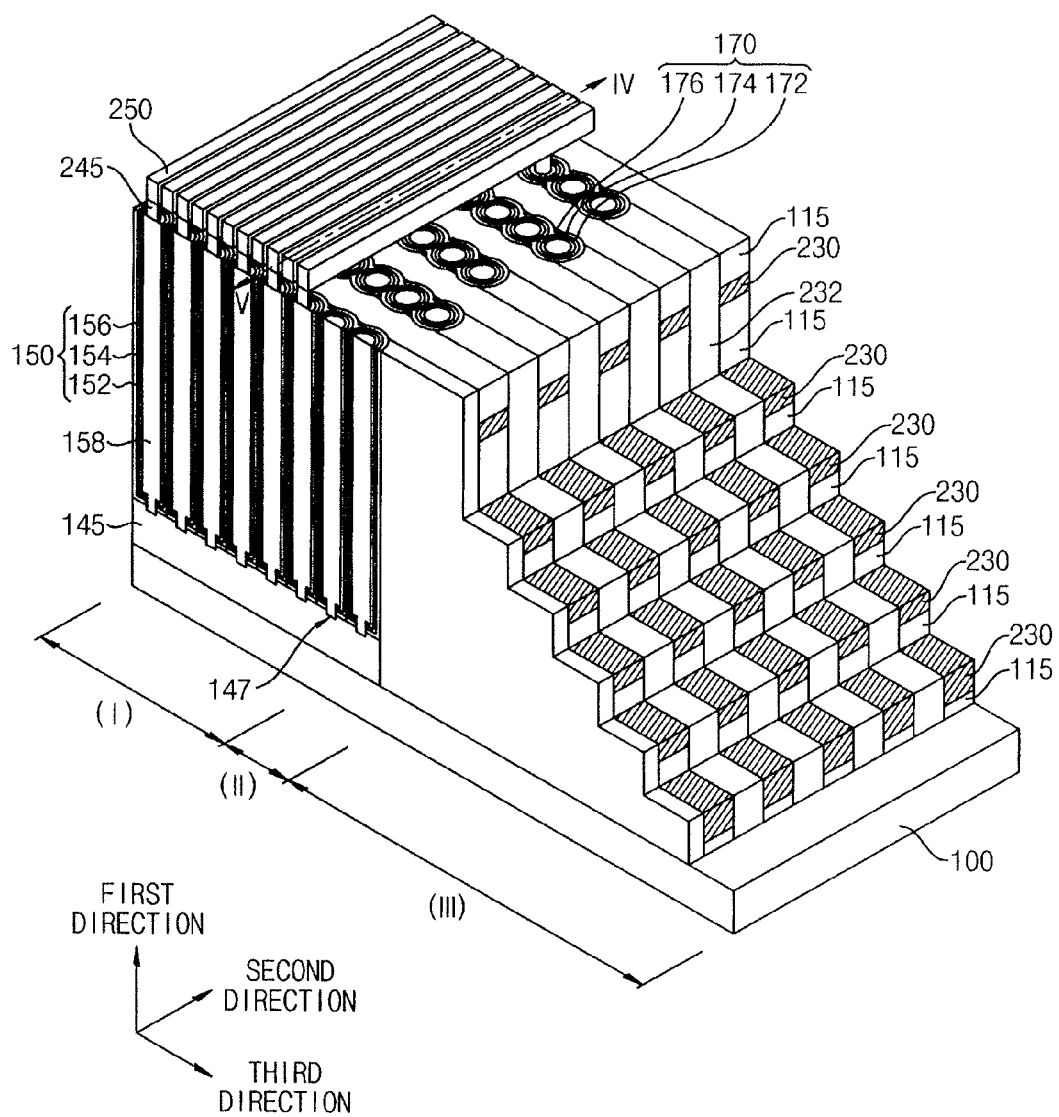
Figure 20B:
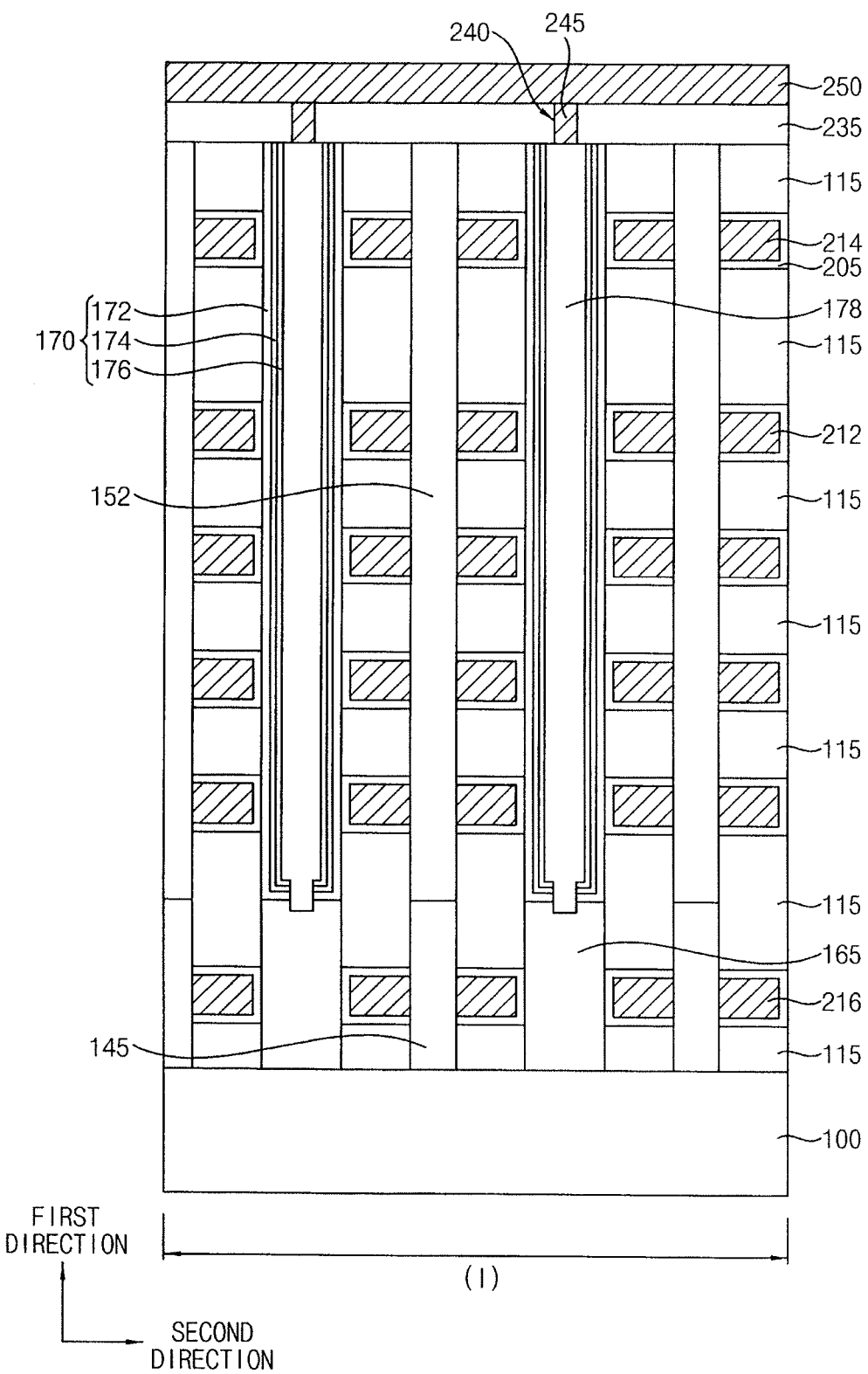

Referring to FIGS. 20A and 20B, a bit line contact 245 may be formed on the first channel 158 and the second channel 178, and a bit line 250 may be formed to be connected thereto. Particularly, a fourth insulation layer 235 may be formed on the second insulation layer pattern 130, the first channels 158, the second channels 178, and the first insulation layer pattern 115, and the third opening 240 exposing a top surface of the first channel 158 and the second channel 178 may be formed. In example embodiments, a plurality of the third openings 240 may be formed to define a third opening array corresponding to the first channels 158 and the second channels 178.

After that, the bit line contacts 245 filling each third opening 240 may be formed on the first and second channels 158 and 178, and a bit line 250 electrically connected to the bit line contacts 245 may be formed. In example embodiments, the bit line 250 may be extended in the second direction, and a plurality of bit lines 250 may be arranged in the third direction.

Figure 21:
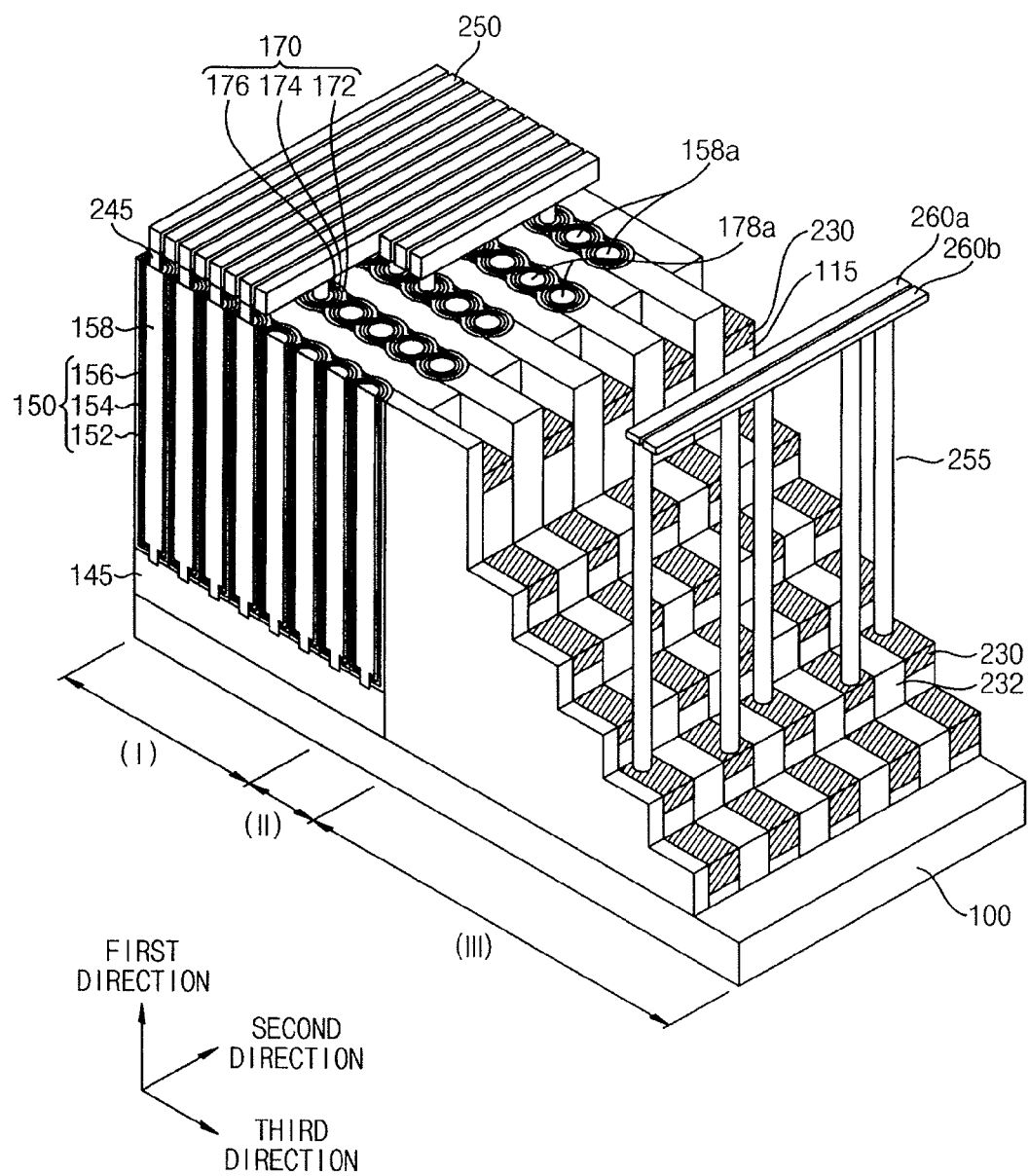

Referring to FIG. 21, a connecting line contact 225 may be formed on the word line pad 230, and connecting lines 260a and 260b connecting thereto may be formed. In example embodiments, the connecting lines 260a and 260b may include a metal, a metal nitride, doped polysilicon, and the like. In example embodiments, each of the first and second connecting lines 260a and 260b may be extended in the second direction, and a plurality of first and second connecting lines 260a and 260b may be arranged in the third direction. Each of the first and second connecting lines 260a and 260b may be formed corresponding to the word line pads 230 formed at the same layer.

In other words, the word line pads may be alternately and repeatedly connected to the first and second connecting lines 260a and 260b through the connecting line contact 255 arranged in a zigzag pattern. For example, when the single word line pad 230 is connected to the first connecting line 260a, the other word line pads 230 adjacent there to may be connected to the second connecting line 260b. Thus, different voltages may be applied to the word line pads 230 adjacent thereto and the word lines 212 connected thereto.

Figure 22:
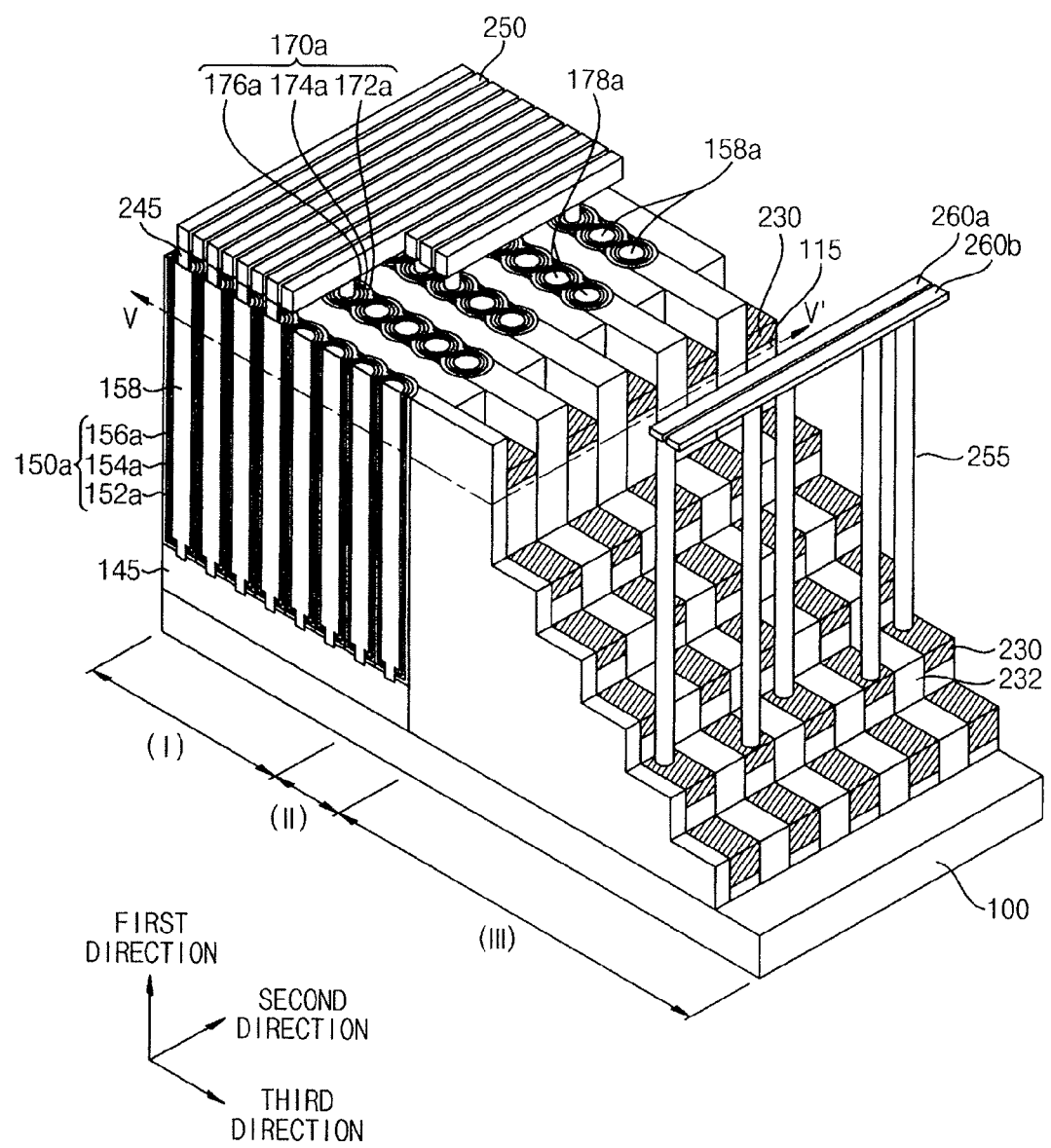
FIG. 22 illustrates another embodiment of a vertical memory device.
Figure 23:
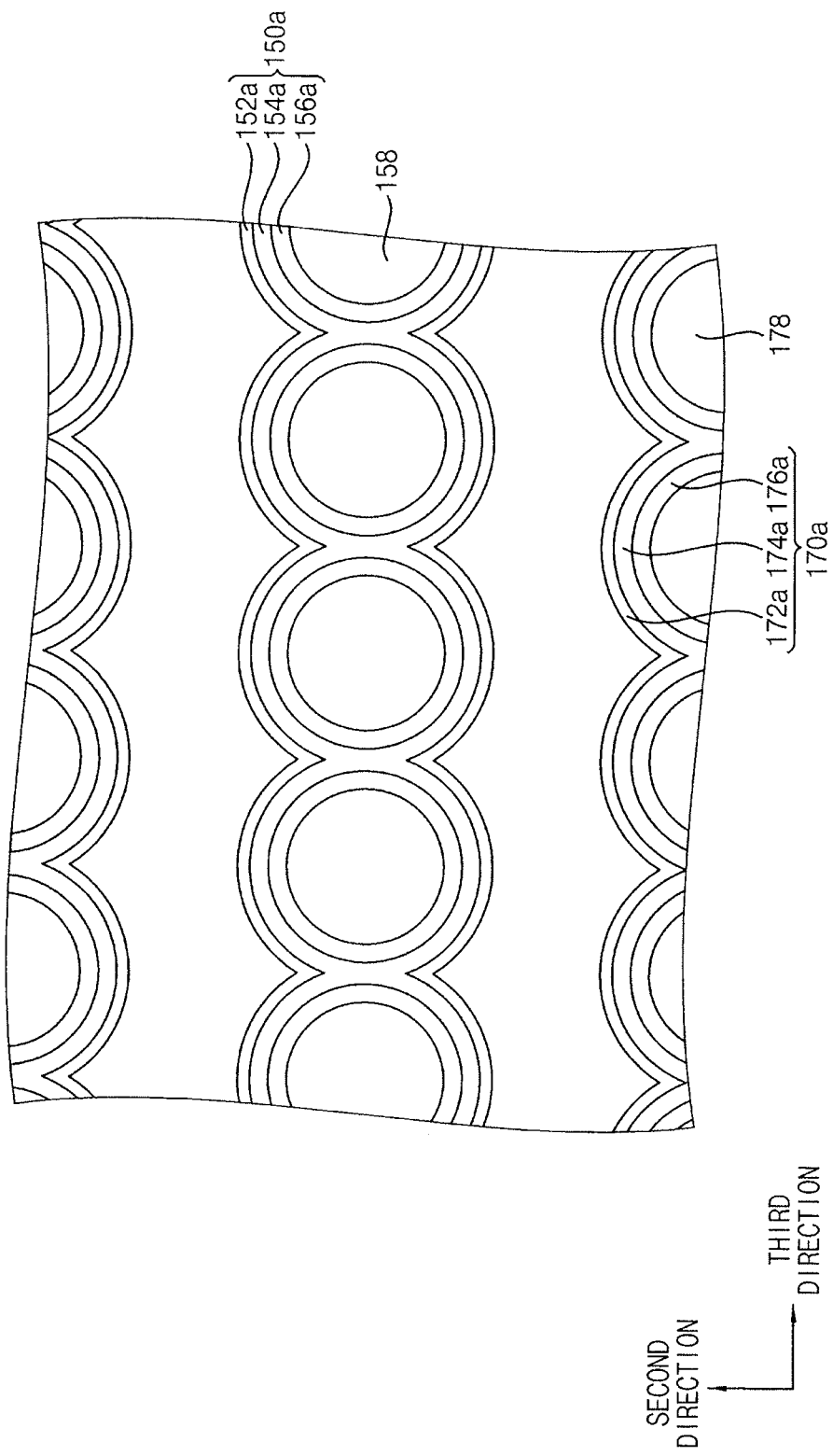
FIG. 23 illustrates a cross-sectional view of the device in FIG. 22.

FIG. 22 illustrates another embodiment of a vertical memory device, and FIG. 23 illustrates a local horizontal cross-sectional view of the semiconductor device in FIG. 22. The vertical memory device may be substantially the same as that of FIGS. 1 to 5, except for the first charge storage structure 150a and the second charge storage structure 170a.

Referring to FIG. 22, the vertical memory device may include a plurality of first and second channels 158 and 178, and first and second charge storage structures 150a and 170a sequentially stacked to surround an outer wall of each first and second channels 158 and 178. The vertical memory device may be formed to include gate electrodes 212, 214, and 216 formed on sidewalls of auxiliary blocking layer patterns 205 to surround a portion of the side wall of certain first and second channels 158 and 178. The vertical memory device may further include bit lines 250 and connecting lines 260a and 260b.

The first and second charge storage structures 150a and 170a may be formed to include first and second tunnel insulation layer patterns 156a and 176a, first and second charge storage layer patterns 154a and 174a, and first and second blocking layer patterns 152a and 172a, respectively.

In example embodiments, the first and second tunnel insulation layer patterns 156a and 176a may be formed to include an oxide e.g., silicon oxide The first and second charge storage layer patterns 154a and 174a may include a nitride, e.g., silicon nitride. The first and second blocking layer patterns 152a and 172a may include a oxide, e.g., silicon oxide.

Referring to FIG. 23, each of the first blocking layer patterns 152a and the first charge storage layer patterns 154a may be arranged to contact each other in the third direction. Thus, the first blocking layer patterns 152a and the first charge storage layer patterns 154a may be formed to contiguously surround, as a whole, a plurality of the first channels 158 included in each of the first channel columns. On the other hand, each of the tunnel insulation layer patterns 156a may be arranged to be spaced apart from each other in the third direction. Each of the first tunnel insulation layer patterns 156a corresponding to each of the first channels 158 may be arranged to be spaced apart from each other in the third direction by the first charge storage layer pattern 154a.

Similarly, each of the second blocking layer patterns 172a and the first charge storage layer patterns 174a may be arranged to contact each other in the third direction. Thus, the second blocking layer patterns 172a and the second charge storage structures 174a may be formed to contiguously surround, as a whole, a plurality of the second channels 178a included in each of the second channel column.

Figure 24:
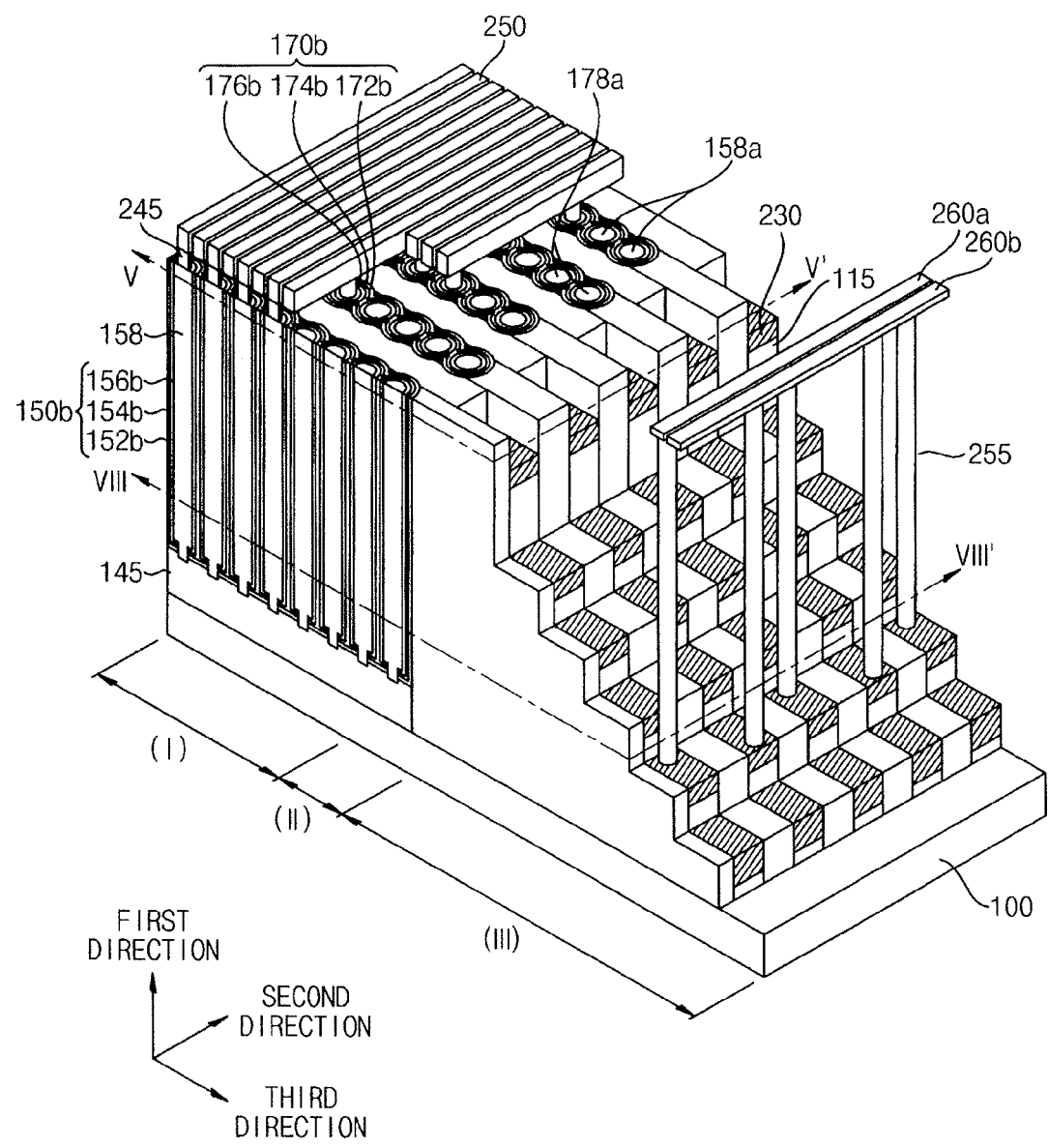
FIG. 24 illustrates another embodiment of a vertical memory device.
Figure 25:
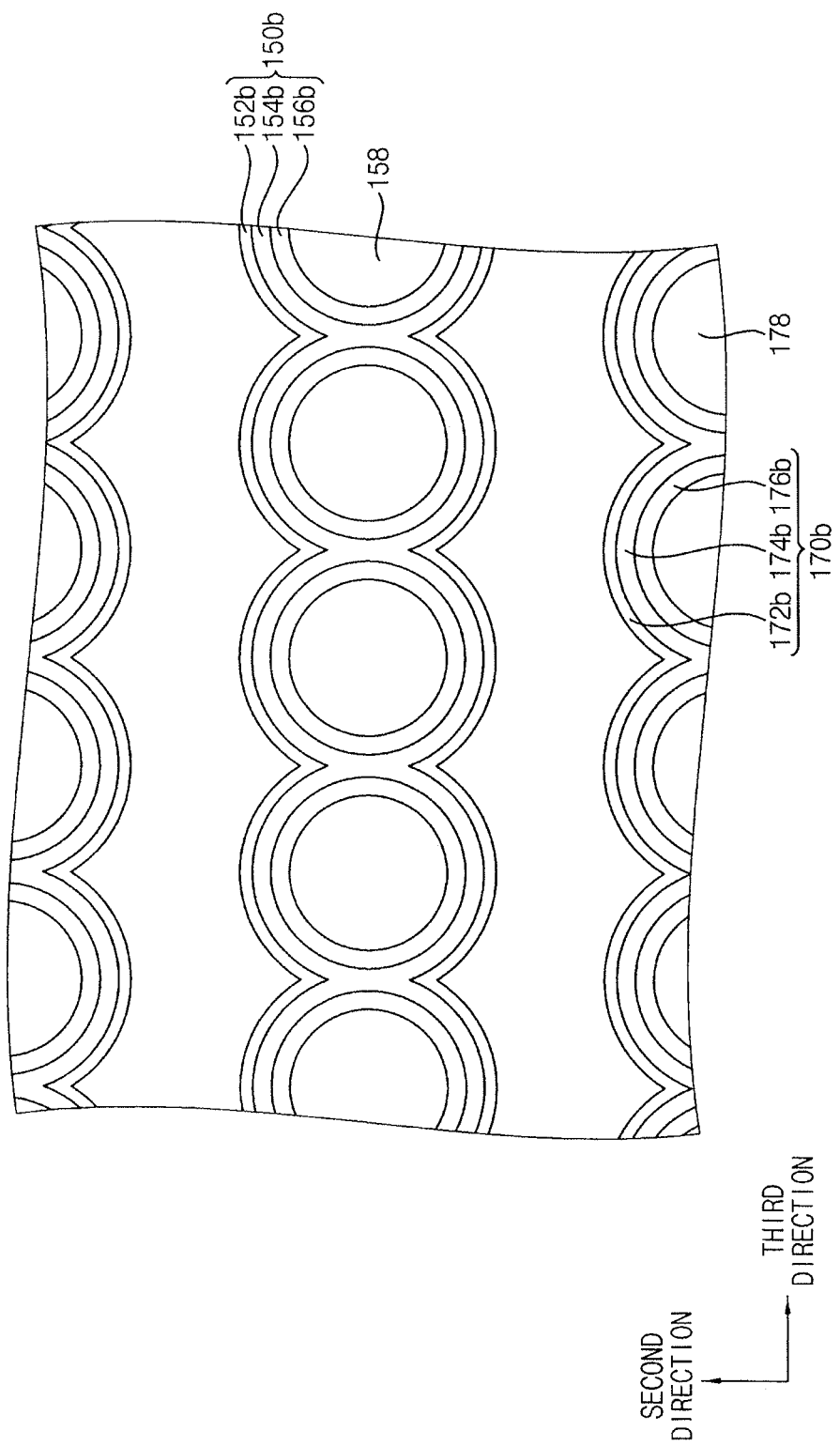
FIGS. 25 and 26 illustrate cross-sectional views of the device in FIG. 24.
Figure 26:
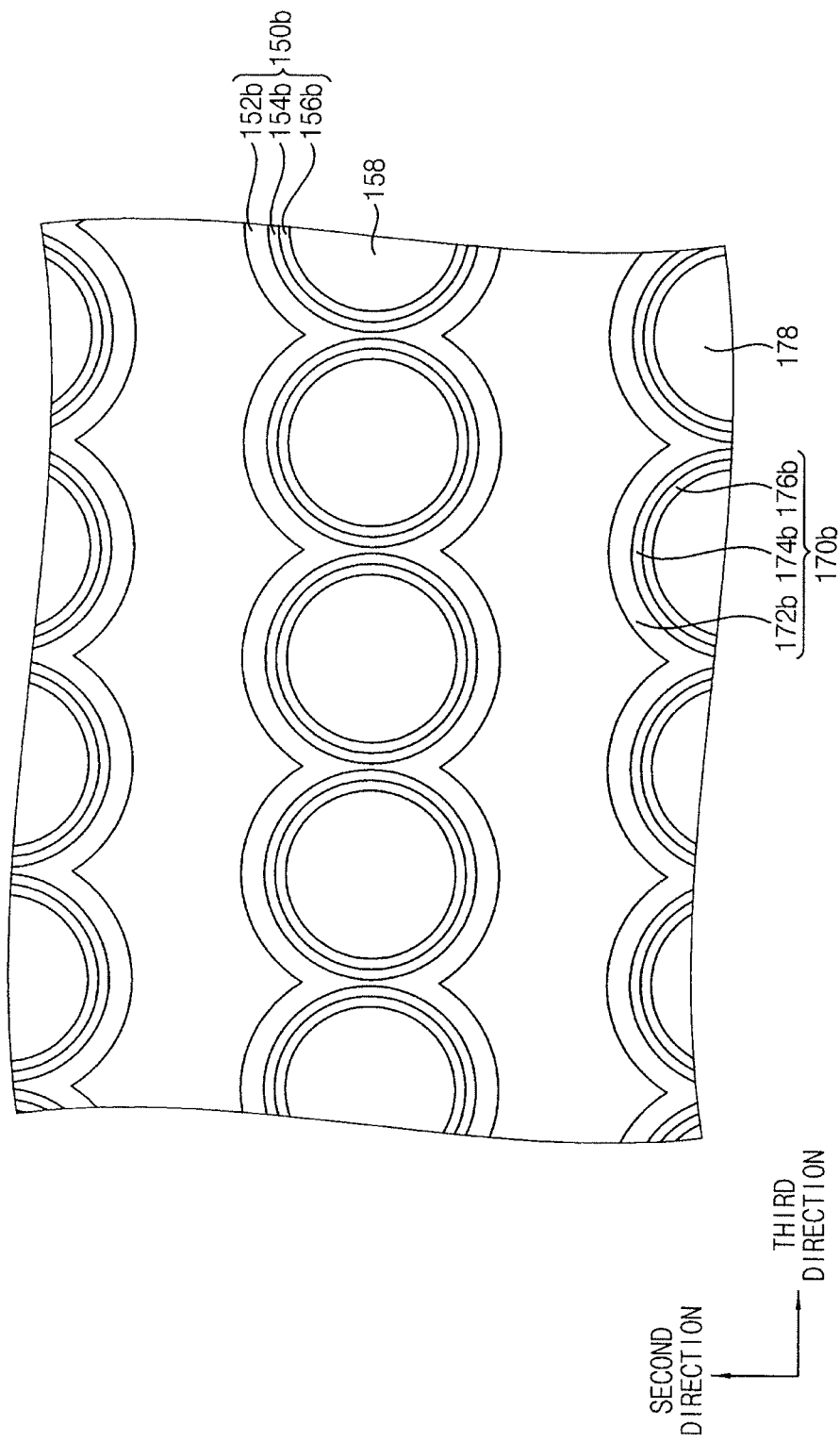

FIG. 24 illustrates another embodiment of a vertical memory device, and FIGS. 25 and 26 illustrate local horizontal cross-sectional views of the semiconductor device. The vertical memory device may be substantially the same as that of FIGS. 1 to 5, except for the first charge storage structure 150b and the second charge storage structure 170b.

Referring to FIG. 24, the vertical memory device may be formed to include a plurality of first and second channels 158 and 178 which are extended in the first direction, respectively, and first and second charge storage structures 150b and 170b sequentially stacked to surround an outer wall of each first and second channels 158 and 178. The vertical memory device may be formed to include gate electrodes 212, 214, and 216 formed on sidewalls of auxiliary blocking layer patterns 205 to surround a portion of an outer side wall of certain first and second channels 158 and 178. The vertical memory device may be formed to further include bit lines 250 and connecting lines 260a and 260b.

The first and second charge storage structure 150b and 170b may be formed to include first and second tunnel insulation layer patterns 156b and 176b, first and second charge storage layer patterns 154b and 174b, and first and second blocking layer patterns 152b and 172b, respectively.

A hole at which the first and second channels 158 and 178 and the first and second charge storage structures 150b and 107b formed may have an inclined lateral surfaces. In other words, an upper portion of the hole may have a larger surface than a lower portion of the hole. Thus, the upper portion and the lower portion of the first and second charge storage structures 150b and 170b may have structures different from each other.

FIG. 25 illustrates a cross-sectional views of an upper portion of the first and second charge storage structures 150b and 170b spaced apart from the top surface of the substrate cut along the line V-V'. FIG. 26 illustrates a cross-sectional views of a lower portion of the first and second charge storage structures 150b and 170b spaced apart from the top surface of the substrate cut along the line VIII-VIII'

Referring to FIG. 25, the upper portion of the first and second charge storage structures 150b and 170b may have structures substantially similar to that of the first and second charge storage structures 150 and 170 illustrated with reference to FIG. 3. Thus, the first blocking layer patterns 152b may be formed to contiguously surround, as a whole, upper portions of a plurality of the first channels 158 included in each of the first channel columns. On the other hand, each of the tunnel insulation layer patterns 156b and the charge storage structures 154b may be arranged to be spaced apart from each other in the third direction.

Referring to FIG. 26, a lower portion of the first and second charge storage structures 150b and 170b may have structures substantially similar to that of the first and second charge storage structures 150 and 170a illustrated with reference to FIG. 23. Thus, the first blocking layer patterns 152b may be formed to contiguously surround, as a whole, lower portions of a plurality of the first channels 158 included in each of the first channel columns. On the other hand, each of the tunnel insulation layer patterns 156a may be arranged to be spaced apart from each other in the third direction.

By way of summation and review, heretofore in a conventional method of manufacturing a vertical non-volatile memory device, holes may be formed through the insulation layers and the sacrificial layers, and oxide/nitride/oxide (ONO) layers and channels filling the holes may be formed. After then, a hole may be formed through the insulation layers and the sacrificial layers, and oxide/nitride/oxide (ONO) layers and channels filling the holes may be formed A gate structure including a gate electrode may be formed to fill the gap.

In example embodiments, holes may extend along a horizontal direction as well as a perpendicular direction. A plurality of the channels and ONO layers may be formed in each of the holes. In this case, two charge storage sites may be formed in a direction perpendicular to the direction at which the holes are extended. Thus, the number of charge storage sites in a given area may be increased.

In order to separate electrodes corresponding to each channel, an insulation pattern may be formed on a region (e.g., word line cut region) where the opening exists. The number of channels and charge storage site in a given area may be reduced depending on the location of the insulation pattern.

In contrast, in example embodiments, holes may extend along a horizontal direction as well as a perpendicular direction. A plurality of the channels and ONO layers may be formed in each of the holes. In this case, two charge storage sites may be formed in a direction perpendicular to the direction at which the holes are extended. Thus, the number of charge storage sites in a given area may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
   a plurality of channel columns including a plurality of channels extending in a first direction perpendicular to a top surface of a substrate, the channels being arranged along a third direction parallel to the top surface of the substrate;
   a plurality of charge storage structures including a plurality of tunnel insulation layer patterns, a plurality of charge storage layer patterns, and a blocking layer pattern respectively, the plurality of tunnel insulation layer patterns and the plurality of charge storage layer patterns being sequentially stacked on sidewalls of respective ones of the channels, the blocking layer pattern surrounding the charge storage layer patterns formed on the sidewalls of the channels included in each channel column; and
   a plurality of gate electrodes spaced apart from each other in the first direction on the sidewalls of each charge storage structure.

2. The vertical memory device as claimed in claim 1, wherein the charge storage layer patterns are spaced apart from each other by the blocking layer pattern in the third direction.

3. The vertical memory device as claimed in claim 1, wherein the charge storage layer patterns contact each other in the third direction.

4. The vertical memory device as claimed in claim 1, wherein the gate electrodes are spaced apart from each other along a second direction perpendicular to the third direction by the channel columns and the charge storage structures.

5. The vertical memory device as claimed in claim 4, wherein the channel columns and the charge storage structures are alternately and repeatedly arranged in the second direction.

6. The vertical memory device as claimed in claim 4, wherein each of the charge storage layer patterns include two charge storage sites spaced apart from each other in the second direction having each of the channels as a center.

7. The vertical memory device as claimed in claim 1, wherein a distance between centers of adjacent channels in the third direction is smaller than a width of the charge storage structure in a second direction.

8. The vertical memory device as claimed in claim 1, further comprising word line pads contacting each of the gate electrodes and extending in the third direction.

9. The vertical memory device as claimed in claim 8, wherein further comprises dummy channels arranged between the channels and the word line pads.

10. A method of manufacturing a vertical memory device, comprising:
    forming a plurality of insulation layers and a plurality of sacrificial layers alternately and repeatedly on a substrate;
    forming a plurality of first holes through the insulation layers and the sacrificial layers in a second direction to expose a top surface of the substrate, the first holes extending in a third direction substantially parallel to the top surface of the substrate;
    forming a first blocking layer pattern, first charge storage layer patterns, first tunnel insulation layer patterns, and first channels on sidewalls of the first holes;
    forming a plurality of second holes through the insulation layers and the sacrificial layers between the first holes to expose the top surface of the substrate, and the second holes extending in the third direction;
    removing the sacrificial layers exposed by the second holes to form a plurality of gaps between the insulation layers in a first direction passing through the top surface of the substrate;
    forming a gate electrode to fill each of the gaps; and
    forming a second blocking layer pattern, second charge storage layer patterns, second tunnel insulation layer patterns, and second channels on a sidewall of each of the second holes.

11. The method as claimed in claim 10, wherein the first channels are spaced apart from one another in the third direction.

12. The method as claimed in claim 10, wherein forming the plurality of first holes includes:
    forming first preliminary holes through the insulation layers and the sacrificial layers to expose the substrate in the third direction; and
    partially removing the insulation layers and sacrificial layers exposed by the first preliminary holes to allow the first preliminary holes to be in fluid communication with each other in the third direction.

13. The method as claimed in claim 12, wherein a width of each of the holes in the second direction is larger than a distance between centers of adjacent ones of the first preliminary holes in the third direction.

14. The method as claimed in claim 10, wherein forming the gate electrode includes:
    forming a gate electrode layer filling the gaps and the second holes; and
    removing a portion of the gate electrode filling the second holes.

15. The method as claimed in claim 14, wherein forming the gate electrodes includes forming the gate electrodes to be spaced apart from each other in the second direction.

16. A memory device, comprising:
    a plurality of channels;
    a plurality of first charge storage sites coupled to first sides of respective ones of the channels; and
    a plurality of second charge storage sites coupled to second sides of respective ones of the channels, wherein the first charge storage sites correspond to first memory cells and the second charge storage sites correspond to second memory cells.

17. The device as claimed in claim 16, further comprising:
    a first blocking layer and a second blocking layer contiguously formed, respectively, around the first and second charge storage sites and the channels.

18. The device as claimed in claim 17, wherein a distance between centers of adjacent ones of the channels is less than a distance between a first surface of the first blocking layer adjacent the first charge storage sites and a second surface of the second blocking layer adjacent the second charge storage sites.

19. The device as claimed in claim 16, wherein:
    at least one channel is a dummy channel not coupled to a bit line, and
    at least another channel is coupled to the bit line.

20. The device as claimed in claim 16, wherein the channels are substantially in a shape of a column.

* * * * *